United States Patent
Walker et al.

(10) Patent No.: US 7,236,464 B2
(45) Date of Patent: Jun. 26, 2007

(54) FLEXIBLE METHOD AND APPARATUS FOR ENCODING AND DECODING SIGNALS USING A TIME DIVISION MULTIPLE FREQUENCY SCHEME

(75) Inventors: Michael L. Walker, San Diego, CA (US); Gerald D. Rogerson, Poway, CA (US); Stephan W. Gehring, Menlo Park, CA (US)

(73) Assignee: General Atomics, San Diego, CA (US)

( * ) Notice: Subject to any disclaimer, the term of this patent is extended or adjusted under 35 U.S.C. 154(b) by 1038 days.

(21) Appl. No.: 10/371,799

(22) Filed: Feb. 20, 2003

(65) Prior Publication Data

US 2004/0028012 A1    Feb. 12, 2004

Related U.S. Application Data

(63) Continuation-in-part of application No. 10/255,111, filed on Sep. 26, 2002, now Pat. No. 6,895,059, and a continuation-in-part of application No. 10/255,103, filed on Sep. 26, 2002, now Pat. No. 6,781,470.

(60) Provisional application No. 60/359,147, filed on Feb. 20, 2002, provisional application No. 60/359,095, filed on Feb. 20, 2002, provisional application No. 60/359,094, filed on Feb. 20, 2002, provisional application No. 60/359,064, filed on Feb. 20, 2002, provisional application No. 60/359,046, filed on Feb. 20, 2002, provisional application No. 60/359,045, filed on Feb. 20, 2002, provisional application No. 60/359,044, filed on Feb. 20, 2002, provisional application No. 60/326,093, filed on Sep. 26, 2001.

(51) Int. Cl.
*H04L 5/14* (2006.01)

(52) U.S. Cl. .................. 370/295; 370/281; 714/701
(58) Field of Classification Search ............... 370/280, 370/281, 294, 295; 714/776, 822
See application file for complete search history.

(56) References Cited

U.S. PATENT DOCUMENTS 3,299,427 A    1/1967    Kondo et al.

(Continued)

FOREIGN PATENT DOCUMENTS

WO    WO 02/31986 A2    4/2002

OTHER PUBLICATIONS

*PCT International Search Report*, United States International Search Authority (US/ISA), from corresponding PCT Application No. PCT/US03/05309, mailed Sep. 23, 2003, 5 pages.

(Continued)

*Primary Examiner*—Doris H. To
*Assistant Examiner*—Steven A Blount
(74) *Attorney, Agent, or Firm*—Fitch, Even, Tabin & Flannery

(57) ABSTRACT

A method and apparatus for signal detection and error detection in a multi-band system, the method for error detection comprising the steps: receiving a plurality of bursts, each burst occupying at least one of a plurality of frequency bands, the plurality of bursts encoding a symbol, the symbol corresponding to data, wherein the symbol is encoded such that a burst occupying each frequency band is transmitted a specified number of times within the plurality of bursts; determining that a given burst has not been detected the specified number of times; and declaring a transmission error for the symbol. In one variation, the frequency bands comprise wideband frequency bands.

17 Claims, 20 Drawing Sheets

U.S. PATENT DOCUMENTS

| | | | |
|---|---|---|---|
| 3,728,632 A | 4/1973 | Ross | |
| 3,806,795 A | 4/1974 | Morey | |
| 3,945,012 A | 3/1976 | Cooper | |
| 4,105,950 A | 8/1978 | Dingwall | |
| 4,309,703 A | 1/1982 | Blahut | |
| 4,354,269 A | 10/1982 | Vries et al. | |
| 4,486,882 A | 12/1984 | Piret et al. | |
| 4,517,532 A | 5/1985 | Neidorff | |
| 4,614,945 A | 9/1986 | Brunius et al. | |
| 4,743,906 A | 5/1988 | Fullerton | |
| 4,813,057 A | 3/1989 | Fullerton | |
| 4,891,609 A | 1/1990 | Eilley | |
| 4,978,927 A | 12/1990 | Hausman et al. | |
| 4,979,186 A | 12/1990 | Fullerton | |
| 4,980,897 A | 12/1990 | Decker et al. | |
| 5,045,811 A | 9/1991 | Lewis | |
| 5,050,188 A | 9/1991 | Dirr | |
| 5,208,557 A | 5/1993 | Kersh, III | |
| 5,262,735 A | 11/1993 | Hashimoto et al. | |
| 5,274,629 A | 12/1993 | Helard et al. | |
| 5,331,294 A | 7/1994 | Watanabe et al. | |
| 5,345,471 A | 9/1994 | McEwan | |
| 5,361,070 A | 11/1994 | McEwan | |
| 5,363,108 A | 11/1994 | Fullerton | |
| 5,418,499 A | 5/1995 | Nakao | |
| 5,420,546 A | 5/1995 | Watanabe et al. | |
| 5,455,593 A | 10/1995 | Ross | |
| 5,465,076 A | 11/1995 | Yamauchi et al. | |
| 5,471,176 A | 11/1995 | Henson et al. | |
| 5,471,223 A | 11/1995 | McCorkle | |
| 5,475,344 A | 12/1995 | Maneatis et al. | |
| 5,475,677 A | 12/1995 | Arnold et al. | |
| 5,504,783 A | 4/1996 | Tomisato et al. | |
| 5,523,758 A | 6/1996 | Harmuth | |
| 5,523,760 A | 6/1996 | McEwan | |
| 5,586,145 A | 12/1996 | Morgan et al. | |
| 5,592,170 A | 1/1997 | Price et al. | |
| 5,592,177 A | 1/1997 | Barrett | |
| 5,648,967 A | 7/1997 | Schulz | |
| 5,661,762 A * | 8/1997 | Petranovich et al. | 375/347 |
| 5,666,382 A | 9/1997 | Thakore | |
| 5,677,927 A | 10/1997 | Fullerton et al. | |
| 5,710,765 A | 1/1998 | Lee et al. | |
| 5,764,690 A | 6/1998 | Blanchard et al. | |
| 5,774,450 A | 6/1998 | Harada et al. | |
| 5,790,527 A | 8/1998 | Janky et al. | |
| 5,815,794 A | 9/1998 | Williams | |
| 5,854,603 A | 12/1998 | Heger | |
| 5,880,699 A | 3/1999 | McCorkle | |
| 5,883,591 A | 3/1999 | McEwan | |
| 5,901,172 A | 5/1999 | Fontana et al. | |
| 5,952,956 A | 9/1999 | Fullerton | |
| 6,002,708 A | 12/1999 | Fleming et al. | |
| 6,008,700 A | 12/1999 | Pietrzyk | |
| 6,026,125 A | 2/2000 | Larrick, Jr. et al. | |
| 6,031,862 A | 2/2000 | Fullerton et al. | |
| 6,054,950 A | 4/2000 | Fontana | |
| 6,061,406 A | 5/2000 | Carson et al. | |
| 6,151,296 A | 11/2000 | Vijayan et al. | |
| 6,154,501 A | 11/2000 | Friedman | |
| 6,185,258 B1 | 2/2001 | Alamouti et al. | |
| 6,191,724 B1 | 2/2001 | McEwan | |
| 6,198,781 B1 | 3/2001 | Ohno et al. | |
| 6,252,909 B1 | 6/2001 | Tzannes et al. | |
| 6,275,544 B1 | 8/2001 | Aiello et al. | |
| 6,289,038 B1 | 9/2001 | Park | |
| 6,377,566 B1 | 4/2002 | Cupo et al. | |
| 6,407,986 B1 | 6/2002 | Dutta | |
| 6,438,115 B1 | 8/2002 | Mazur et al. | |
| 6,442,211 B1 | 8/2002 | Hampel et al. | |
| 6,442,214 B1 | 8/2002 | Boleskei et al. | |
| 6,445,425 B1 | 9/2002 | Limberg | |
| 6,810,023 B1 * | 10/2004 | Dillinger et al. | 370/281 |
| 2003/0099299 A1 | 5/2003 | Rogerson et al. | |

OTHER PUBLICATIONS

Barrett, *History of Ultra WideBand (UWB) Radar & Communications: Pioneers and Innovators*, Progress In Electromagnetics Symposium 2000 (PIERS2000), Jul. 2000, Cambridge, MA, 42 pages.

Foerster, Jeff et al., *Ultra-Wideband Technology for Short- or Medium-Range Wireless Communications*, Intel Technology Journal Q2, 2001, 11 pages.

Hirt, Walter, *Ultra-Wideband (UWB) Radio Technology (UWB-RT) Short-Range Communication and Location Tracking*, Apr. 12, 2001, 4 pages.

Kahney, Leander, *The Third-Generation Gap*, Scientific American. com (http://www.sciam.com/print_version.cfm?articleID=00031A96-ADF7-1C73-9B81809EC588EF21), Oct. 20, 2000, 4 pages.

McCorkle, John, *Project: IEEE P802.15 Working Group For Wireless Personal Area Networks (WPANS)—A Tutorial on Ultrawideband Technology*, XtremeSpectrum, Inc., Mar. 2000, 34 pages.

* cited by examiner

FLEXIBLE METHOD AND APPARATUS FOR ENCODING AND DECODING SIGNALS USING A TIME DIVISION MULTIPLE FREQUENCY SCHEME

RELATED APPLICATIONS

This application claims priority to U.S. Provisional Patent Applications Nos. 60/359,044 ("POLARITY SIGNALING METHODS BASED ON TDMF UWB WAVEFORMS," filed Feb. 20, 2002); 60/359,045 ("CHANNELIZATION METHODS FOR TIME-DIVISION MULTIPLE FREQUENCY COMMUNICATION CHANNELS," filed Feb. 20, 2002); 60/359,064 ("HYBRID SIGNALING METHODS BASED ON TDMF UWB WAVEFORMS," filed Feb. 20, 2002); 60/359,147 ("TRANSMITTER AND RECEIVER FOR A TIME-DIVISION MULTIPLE FREQUENCY COMMUNICATION SYSTEM," filed Feb. 20, 2002); 60/359,094 ("PHY LEVEL ERROR DETECTION/CORRECTION FOR TDMF," filed Feb. 20, 2002); 60/359,095 ("ADAPTING TDMF SIGNALING TO NARROWBAND INTERFERENCE SOURCES," filed Feb. 20, 2002); and 60/359,046 ("METHOD OF DECODING TO EXPLOIT TDMF (FREQUENCY/TIME) CHARACTERISTICS," filed Feb. 20, 2002); all of which applications are incorporated in their entirety herein by reference.

This application is a continuation-in-part (CIP) of the following U.S. patent applications, all of which are incorporated in their entirety herein by reference: U.S. patent application Ser. No. 10/255,111 ("METHOD AND APPARATUS FOR DATA TRANSFER USING A TIME DIVISION MULTIPLE FREQUENCY SCHEME", filed Sep. 26, 2002, now U.S. Pat. No. 6,895,059); and U.S. patent application Ser. No. 10/255,103 ("TUNABLE OSCILLATOR", filed Sep. 26, 2002, now U.S. Pat. 6,781,470).

This application is related to the following U.S. patent application filed concurrently herewith, all of which are incorporated in its entirety herein by reference: U.S. patent application Ser. No. 10/371,065 ("METHOD AND APPARATUS FOR DATA TRANSFER USING A TIME DIVISION MULTIPLE FREQUENCY SCHEME WITH ADDITIONAL MODULATION", U.S. patent application Ser. No. 10/372,075 ("METHOD AND APPARATUS FOR DATA TRANSFER USING A TIME DIVISION MULTIPLE FREQUENCY SCHEME SUPPLMENTED WITH POLARITY MODULATION", U.S. patent application Ser. No. 10/371,074 ("METHOD AND APPARATUS FOR ADAPTING MULTI-BAND ULTRA-WIDEBAND SIGNALING TO INTERFERENCE SOURCES", and U.S. patent application Ser. No. 10/371,074 ("METHOD AND APPARATUS FOR ADAPTING SIGNALING TO MAXIMIZE THE EFFICIENCY OF SPECTRUM USAGE FOR MULTI-BAND SYSTEMS IN THE PRESENCE OF INTERFERENCE".

BACKGROUND

1. Field of the Invention

This invention generally relates to data transfer over wired, wireless, and/or optical transmission channels. More particularly, this invention relates to encoding and decoding of ultra-wideband signals.

2. Background Information

As computing and communications applications become richer and more complex, there is a need to transfer information between communicating devices at higher and higher data rates. Use of such devices may include large data transfers and/or multimedia applications. For example, multimedia applications may handle multiple simultaneous streams of high-definition audio and/or video coming from devices such as business/entertainment systems and gateways necessitating high-speed connectivity between communicating devices.

Increasingly, such devices are used in mobile and changing environments, where untethered connectivity is not only a convenience for the user, but can be a functional requirement, for example, for cellular phones. Wireless connectivity can provide enhanced capabilities, ease of use, and may result in cost savings and increased productivity. Accordingly, there is a need for high-speed wireless connectivity.

For consumer electronics devices, cost and complexity of transmitter and receiver implementations are important considerations as they can significantly contribute to the device production cost. Such devices therefore benefit greatly from low-cost high-speed wireless connectivity.

Most existing wireless communication schemes transfer data by modulating continuous-wave carriers. In many cases, a portion of the radio-frequency spectrum is reserved for the exclusive use of the scheme. Data transfers may be conducted over very narrow frequency bands in an attempt to occupy less of the frequency spectrum. However, such schemes may be susceptible to increases in background noise level and to multipath interference. Some narrowband schemes may also interfere with other systems (e.g. due to a higher concentration of energy in the particular frequency band being used).

There is therefore a need for schemes for low-cost high-speed wireless devices, which are not susceptible multipath interference. Ultra-wideband (UWB) communication methods transmit information by spreading energy over a large portion of the radio frequency spectrum. Ultra-wideband communications transmit over a very wide bandwidth with very low power density and are less susceptible to multipath interference. It is therefore desirable to provide receivers that provide low-cost high-speed wireless connectivity and that can detect and decode ultra-wideband signaling.

SUMMARY OF THE INVENTION

In one embodiment, the present invention may be characterized as a method of error detection comprising the steps: receiving a plurality of bursts, each burst occupying at least one of a plurality of frequency bands, the plurality of bursts encoding a symbol, the symbol corresponding to data, wherein the symbol is encoded such that a burst occupying each frequency band is transmitted a specified number of times within the plurality of bursts; determining that a given burst has not been detected the specified number of times; and declaring a transmission error for the symbol.

In another embodiment, the present invention may be characterized as a multi-band receiver comprising: a burst detector module configured to receive and detect each of a plurality of bursts, each burst occupying at least one of a plurality of frequency bands, the plurality of bursts encoding a symbol, the symbol corresponding to data, wherein the symbol is encoded such that a burst occupying each frequency band is transmitted a specified number of times within the plurality of bursts; and an error detector coupled to the burst detector module configured to determine that a given burst has not been detected the specified number of times and configured to declare a transmission error for the symbol.

In a further embodiment, the present invention may be characterized as a method of signal detection comprising the steps: receiving a plurality of bursts, each burst occupying at least one of a plurality of frequency bands, the plurality of bursts encoding a symbol, the symbol corresponding to data, wherein the symbol is encoded such that a burst occupying each frequency band is transmitted once in the plurality of bursts; detecting, for a first burst of the plurality of bursts received in time, a first frequency band of the first burst; removing the first frequency band from a list of available frequency bands; detecting, for a subsequent burst of the plurality of bursts received in time, a subsequent frequency band of the subsequent burst; and removing the subsequent frequency band from the list of available frequency bands.

In yet another embodiment, the present invention may be characterized as a multi-band receiver comprising: a burst detector configured to receive a plurality of bursts, each burst occupying at least one of a plurality of frequency bands, the plurality of bursts encoding a symbol, the symbol corresponding to data, wherein the symbol is encoded such that a burst occupying each frequency band is transmitted once in the plurality of bursts; the burst detector configured to detect, for a first burst of the plurality of bursts received in time, a first frequency band of the first burst; and a signal decoder coupled to an output of the burst detector, the signal decoder configured to remove the first frequency band from a list of available frequency bands; the burst detector configured to detect, for a subsequent burst of the plurality of bursts received in time, a subsequent frequency band of the subsequent burst; and the signal decoder configured to remove the subsequent frequency band from the list of available frequency bands.

DETAILED DESCRIPTION

Figure 1:
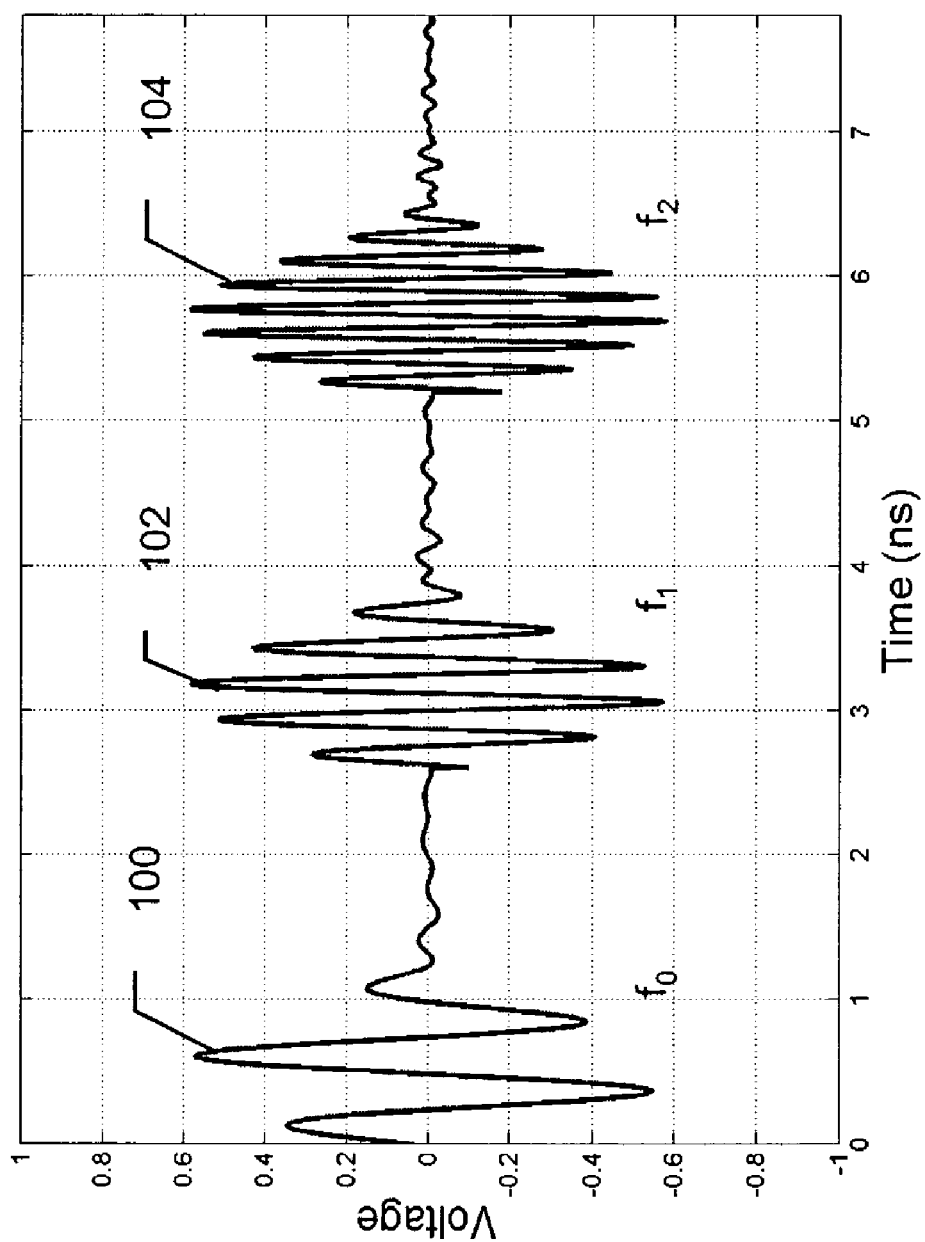
FIG. 1 shows a cluster comprising three frequency bursts in the time domain

In the description and claims that follow, certain terms may be defined as follows:

The term 'frequency band' denotes a contiguous portion of the frequency spectrum. The term 'center frequency' as applied to a frequency band denotes a frequency at the arithmetic mean of the frequencies at the boundaries of the frequency band. The term 'bandwidth' refers to the width of the frequency band, that is, the difference between the frequencies at the upper and lower boundaries. As defined herein, frequency bands may be adjacent to one another and non-overlapping, but may also be disjoint or overlapping.

The term 'burst' denotes the emission of an amount of energy within a particular range of frequencies and over a limited period of time. A burst may include one or more cycles of a waveform (e.g. a sine wave). A burst may even be limited to less than one cycle of a waveform. In some applications, two or more bursts may be transmitted simultaneously. Initiating the transmission of a burst is also referred to as 'triggering' the burst.

The term 'wideband' denotes a signal whose bandwidth is not less than 2% of its center frequency, and the term 'ultra-wideband' denotes a signal whose bandwidth is not less than 20% of its center frequency. For example, the bandwidth of an ultra-wideband signal may be up to 50% or more of the signal's center frequency. Ultra-wideband signals may be used at frequencies from less than tens of hertz to terahertz and beyond. Although most ultra-wideband use currently falls between 100 MHz and 10 GHz primarily due to present-day regulatory allocations, it is envisioned that future allocations will extend far beyond this frequency range.

The term 'time slot' denotes a defined period of time that separates moments at which bursts may be triggered. A period of time may be divided into a continuous series of consecutive and non-overlapping time slots of equal duration. Alternatively, a period of time may be divided into a series of consecutive and non-overlapping time slots of varying duration. In a complex high-speed system, the length of a time slot may be measured in picoseconds. In a lower-speed system of less complexity, the length of a time slot may be in the nanosecond range. In other applications, time slots of shorter or greater length may be used as desired.

In the implementations described herein, the same time slot boundaries are observed across the various frequency bands. However, it is contemplated that two or more different time slot arrangements may be applied among the various frequency bands (e.g. that time slots in one frequency band may be longer than time slots in another frequency band, or that time slots in one frequency band may have constant length while time slots in another frequency band have varying length) in other implementations.

The term 'cluster' denotes a representation of encoding information into a time-ordered sequence of bursts in one or more frequency bands. The term 'cluster interval' denotes the period between the start of transmission of a cluster and the start of transmission of the next cluster and includes any 'quiet time' between the clusters.

'Quiet time' periods between clusters may be especially useful, for example, in asynchronous applications. In such cases, it may be desirable for the duration of a quiet time period to be greater than the duration of a time slot.

Ultra-Wideband technologies using a sub-banded approach, where the information encoding takes place in one or more of the sub-bands either in series and/or in parallel is referred to as a UWB multi-band architecture. For example, ultra-wideband signals are transmitted within more than one frequency sub-bands, each sub-band having an ultra-wideband bandwidth. Many such advantages are derived from such an architecture, like regulatory flexibility, scalability of performance parameters (data rate, power consumption, complexity/cost), and coexistence and interference avoidance.

Figure 2:
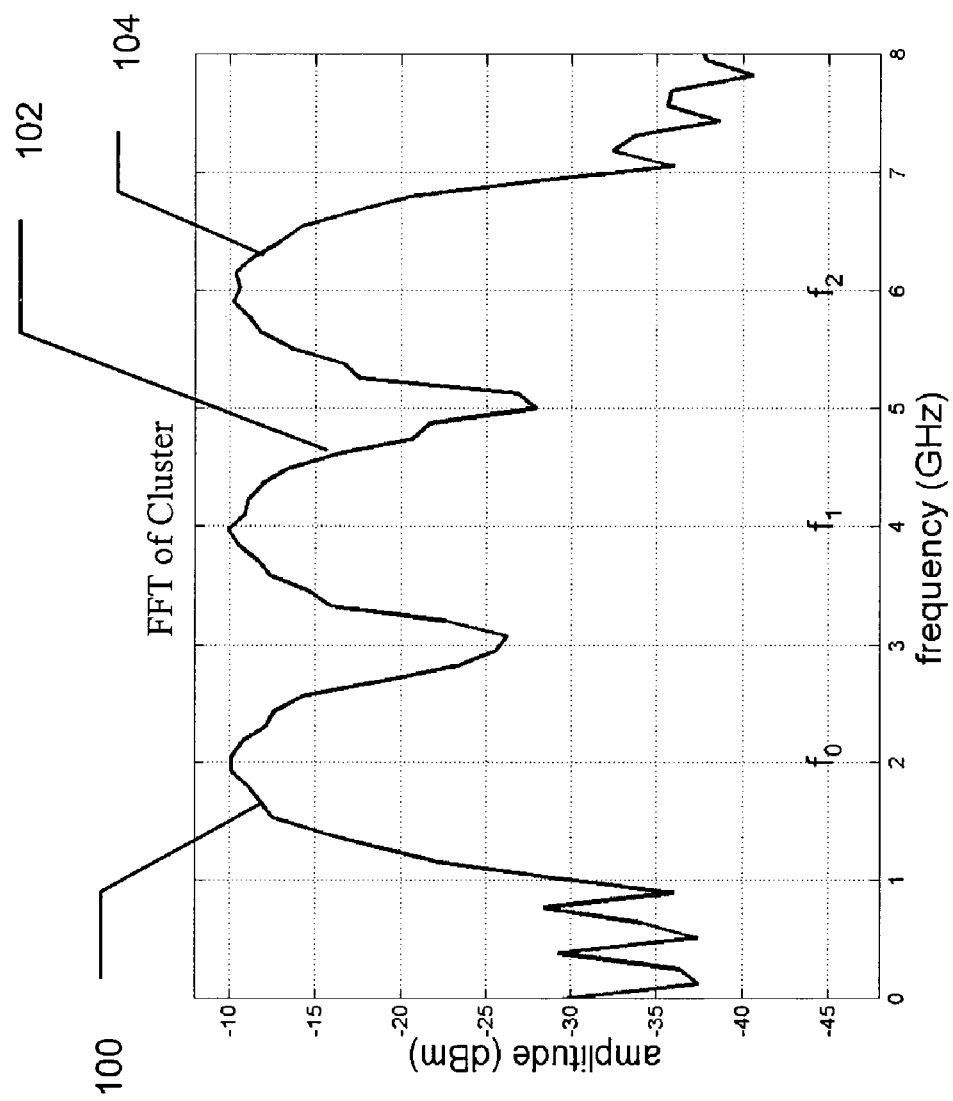
FIG. 2 shows the cluster of FIG. 2 in the frequency domain.

An advanced approach to UWB multi-bands is described in U.S. patent application Ser. No. 10/255,111 (filed Sep. 26, 2002, entitled METHOD AND APPARATUS FOR DATA TRANSFER USING A TIME DIVISION MULTIPLE FREQUENCY SCHEME, which is incorporated herein by reference) and describes a Time Division Multiple Frequency (TDMF) scheme. According to one implementation, a TDMF scheme encodes information (bits) in the time order of transmission of at least one burst within each of multiple sub-bands. That is, data is encoded through the time dependence of frequency bursts within a cluster of bursts. The time and the frequency band at which bursts occur within a cluster carry the information. For example, the order of transmission of bursts across the multiple sub-bands defines a symbol, the symbol corresponds or maps to defined bits. FIG. 1 shows an example of a cluster consisting of a time-sequence of three bursts, e.g., a first burst 100 at $f_0$, a second burst 102 at $f_1$ and a third burst 104 at $f_2$. Each burst lies within a different and easily distinguishable frequency band as shown in the frequency domain of FIG. 2. According to one embodiment of a TDMF transmission scheme, a cluster of bursts $f_0$, $f_1$ and $f_2$, transmitted in successive time slots encodes a symbol, which corresponds to a specific set of data. In preferred embodiments, each burst has a bandwidth of at least 2% of its center frequency, and more preferably at least 20% of its center frequency.

This multi-band scheme can also be augmented with amplitude modulation, polarity modulation, or other modulation schemes known in the art on each of the clusters to increase the data rate even further, for example, such as described in U.S. patent application Ser. No. 10/371,065 (filed concurrently herewith, entitled METHOD AND APPARATUS FOR DATA TRANSFER USING A TIME DIVISION MULTIPLE FREQUENCY SCHEME WITH ADDITIONAL MODULATION, which is incorporated herein by reference) and U.S. patent application Ser. No. 10/371,075 (filed concurrently herewith, entitled "METHOD AND APPARATUS FOR DATA TRANSFER USING A TIME DIVISION MULTIPLE FREQUENCY SCHEME SUPPLMENTED WITH POLARITY MODULATION", which is incorporated herein by reference). In one implementation, this scheme looks at the modulation of the signaling in each of the sub-bands as well as looking at the timing of the transmission and/or reception of each of the sub-bands for the encoding of information. An example is a 3 band system, where each burst has polarity modulation and the timing of the arrival of the 3 modulated bursts collectively map to a specific symbol of defined bits. The TDMF scheme, as well as other multi-band schemes, are required to be well designed for coordinated and uncoordinated collocated systems; otherwise the system may not only be subject to narrowband sources of interference, but potentially self-interference and interference from other UWB systems.

Multi-band is advantageous because it utilizes both time and frequency to achieve high data density. By choosing a large number of frequency bands, a large number of bits may be encoded within each cluster.

Figure 3:
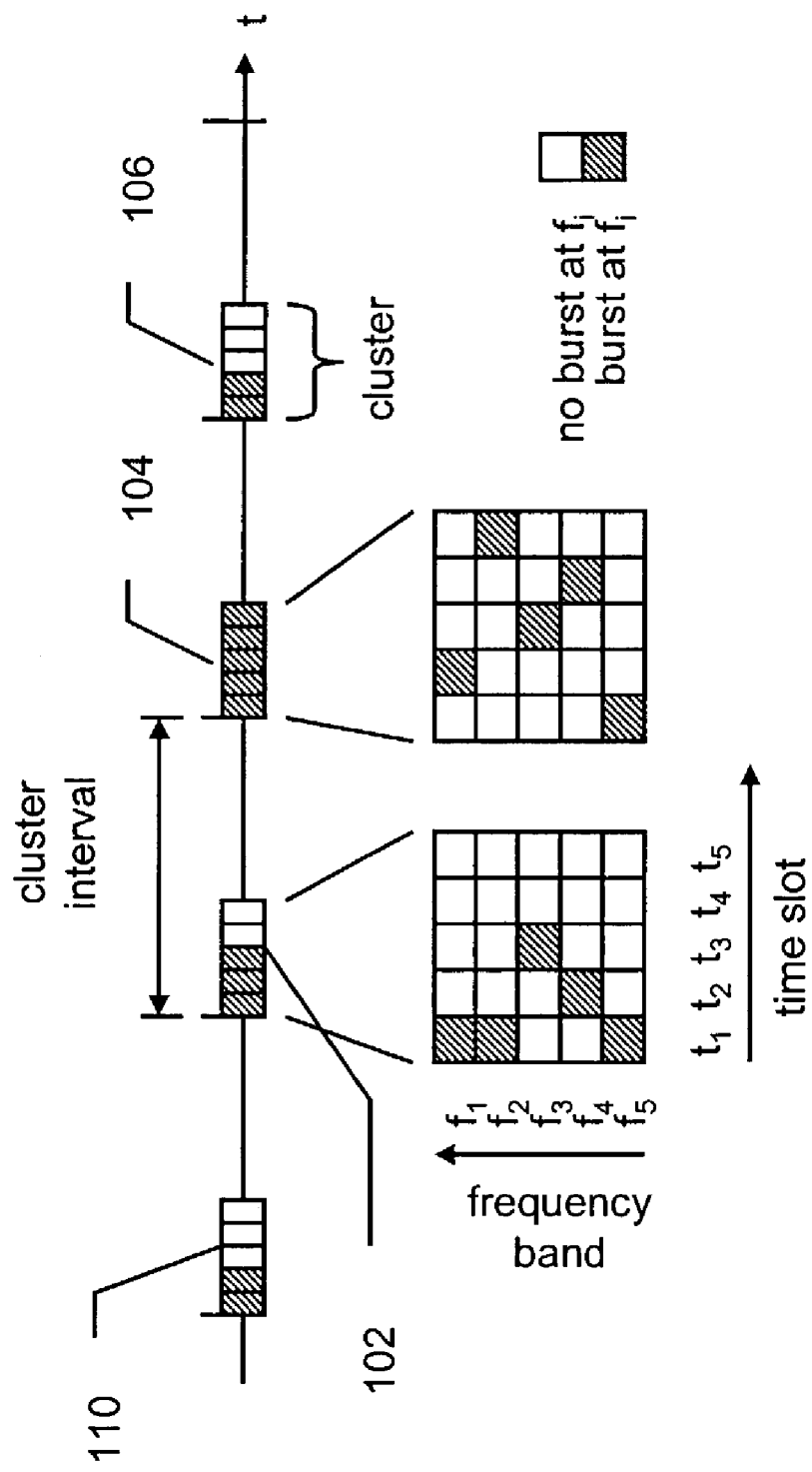
FIG. 3 shows a sequence of multi-band clusters, each composed of multiple bursts in different frequency bands.

FIG. 3 illustrates a sequence of multi-band clusters, e.g., clusters 110, 112, 114 and 116 each composed of multiple bursts in different frequency bands with a cluster interval between the start of successive clusters. In this example, there are five available frequency bands, $f_1$, $f_2$, $f_3$, $f_4$ and $f_5$. Bursts (indicated in shaded time slots) are transmitted in one of five time slots in one of five frequency bands. In one embodiment, the time dependence of bursts across frequency for each cluster encodes a symbol, the symbol mapping to specific data. In cluster 112, it can be seen that multiple bursts may be transmitted at the same time (i.e., three bursts are transmitted in the first time slot), while in cluster 114, only one burst is sent during each time slot. As described in more detail in the above-mentioned U.S. patent applications, this scheme may be varied in numerous ways. For example, the polarity, amplitude, width and/or polarization of each burst may be modulated to encode additional bits into the cluster.

Figure 4:
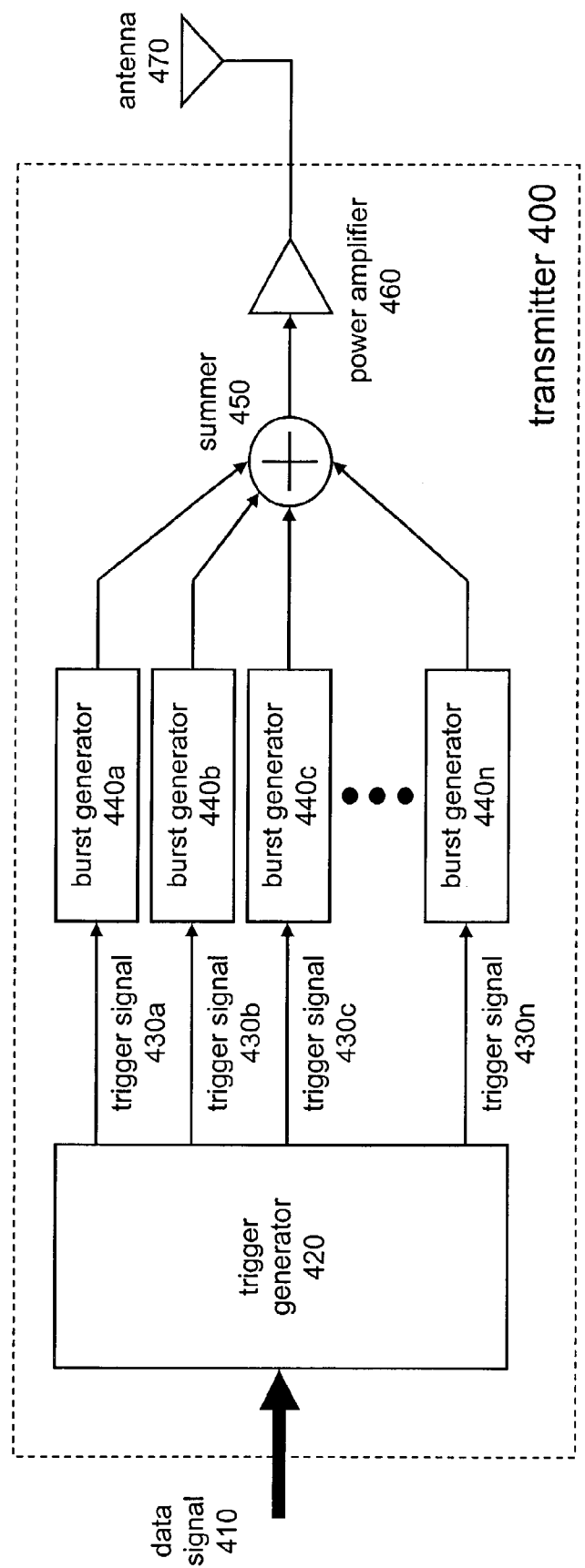
FIG. 4 shows a block diagram of a multi-band transmitter.

FIG. 4 shows a block diagram of a multi-band transmitter 400 according to one embodiment of the invention. It comprises a trigger generator 420, which is coupled to a data source through data signal 410 and to one or more burst generators 440a through 440n. The burst generators are configured to emit bursts in specific frequency bands (e.g., ultra-wideband bursts) and are connected to a summer 450. The summer's output is coupled to the input of an optional power amplifier 460. Power amplifier 460 is further connected to antenna 470.

Figure 5:
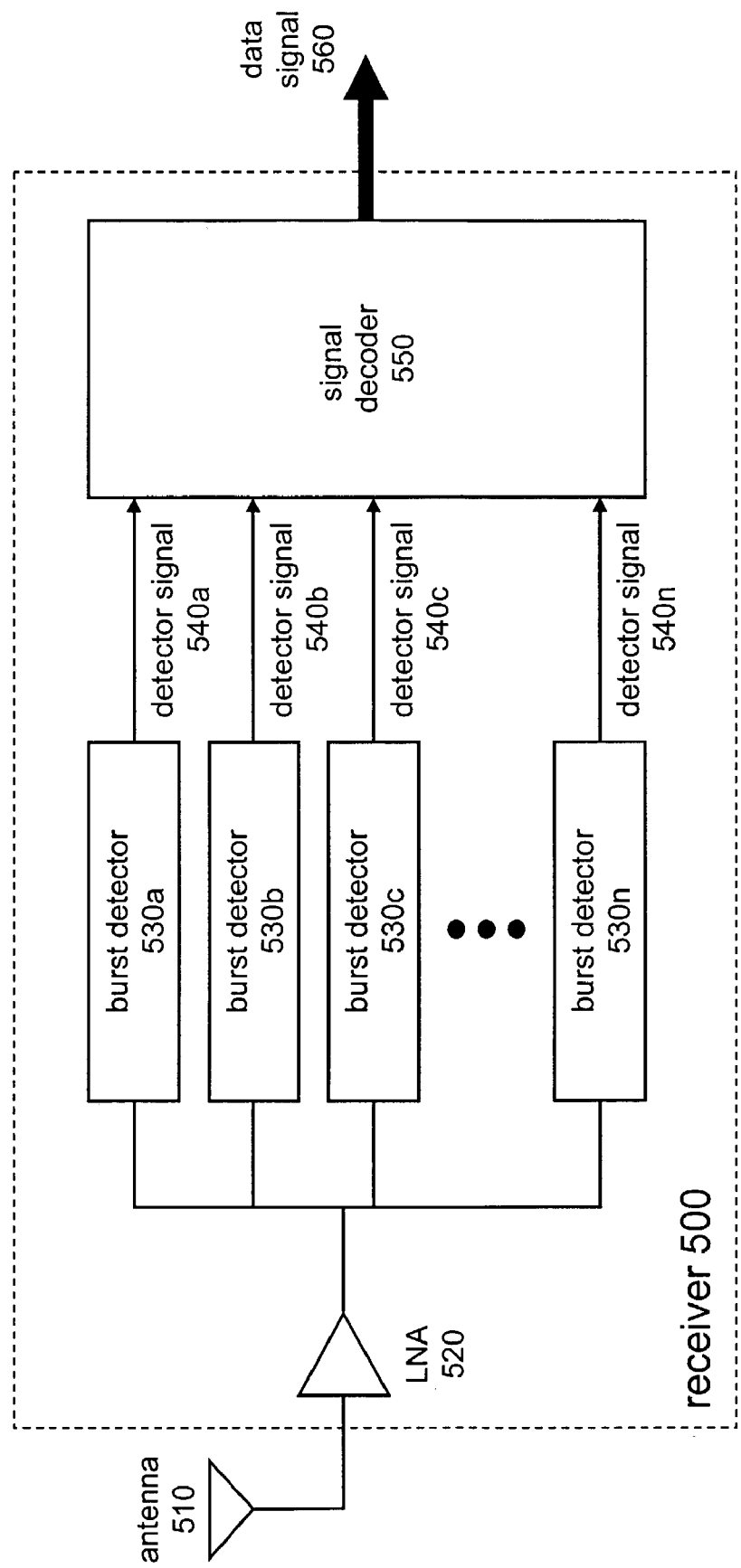
FIG. 5 shows a block diagram of a multi-band receiver.

Trigger generator 420 receives a data signal 410 and encodes the received data into a sequence of trigger signals 430a through 430n, which activate the burst generators 440a through 440n at times according to the encoded data signal. When activated, a burst generator 440 emits a burst in its specific frequency band. Summer 450 combines the burst generator outputs into a signal amplified by power amplifier 460 and radiated through antenna 470. In one embodiment, burst generators 440a through 440n and summer 450 are implemented according to those described in U.S. patent application Ser. No. 10/255,111. In some embodiments, burst generators are activated by a single-bit trigger signal. In other embodiments, burst generators may be activated using multi-bit trigger signals FIG. 5 shows a block diagram of a multi-band receiver 500 according to one embodiment of the invention. It comprises a low-noise amplifier (LNA) 520 whose input is coupled to an antenna 510 and whose outputs are connected to one or more burst detectors 530a through 530n. The outputs of burst detectors 530a through 530n are connected to the inputs of signal decoder 550 through detector signals 540a through 540n.

Electro-magnetic energy received through antenna 510 is amplified by LNA 520 and fed to burst detectors 530a through 530n. Burst detectors 530a through 530n are configured to detect bursts in specific frequency bands. For example, in one embodiment, the burst detectors 530 include a respective bandpass filter, while in another embodiment, the burst detectors 530 include a correlator configured to correlate a respective burst. Upon detecting a burst, a burst detector 530a through 530n signals detection of a burst in its frequency band to attached signal decoder 550. Signal decoder 550 decodes a sequence of detected bursts, constituting a cluster, into a data signal that is communicated to a data sink through data signal 560.

In one embodiment, a burst detector 530a through 530n is configured to communicate the presence or absence of a burst through detector signal 540a through 540n, which may be represented with a single bit of information in detector signal 540a through 540n. In other embodiments, a burst detector 530a through 530n is configured to communicate other and/or additional characteristics of a detected burst, such as its amplitude, its polarity, or other characteristics know in the art, which may be represented by one or more bits of information communicated to signal decoder 550 through detector signal 540a through 540n. Embodiments of burst detector 530a through 530n may be found in U.S. patent application Ser. No. 10/255,111, incorporated herein by reference.

Several embodiments of the invention described herein will generally be described assuming a single bit of information be exchanged between the trigger generator 420 and the burst generator 440 and between the burst detector 530 and the signal decoder 550. Those skilled in the art will readily understand that the generic principles described herein apply in the same way when the information exchanged consists of multiple bits of information. Without loss of generality, the following descriptions use the designator n to refer to the number of burst generators, as well as the number of burst detectors. Designator p is used to denote the maximum number of time slots per cluster, while designator m denotes the number of bits of the data signal entering the transmitter and the number of bits of the data signal exiting the receiver.

Figure 6:
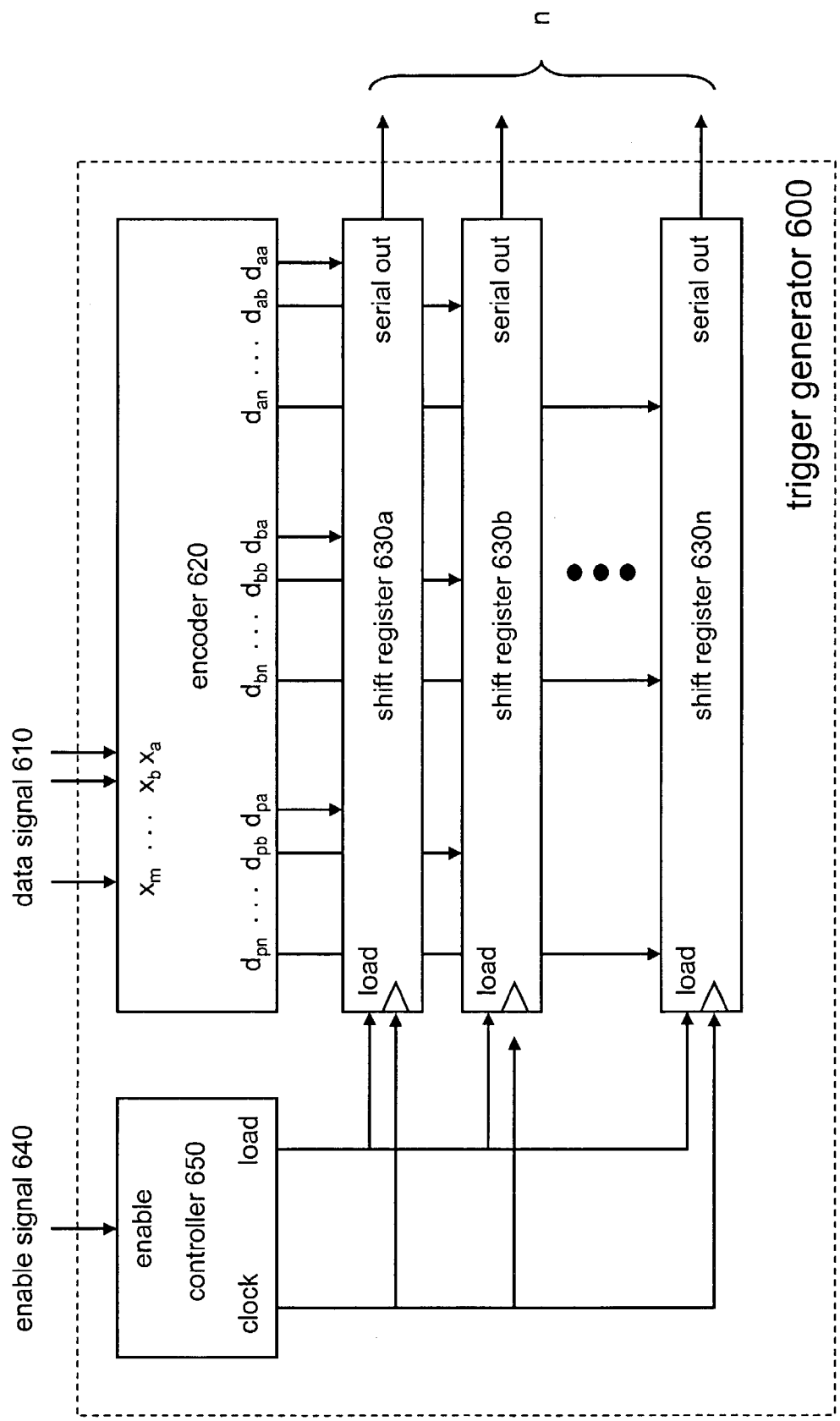
FIG. 6 shows an embodiment of a trigger generator using an encoder and shift registers to control burst generators.

Referring to FIG. 6, an embodiment of a trigger generator 600 is illustrated, which consists of an encoder 620, a shift register for each frequency band (630a through 630n), and a controller 650. Encoder 620 encodes input data 610 into a set of control signals that control the operation of the n burst generators attached to the serial output of the shift registers 630a through 630n. Upon assertion of the load signal by controller 650, the shift registers 630a through 630n are loaded with a set of control signals ($d_{ik}$). Then, by shifting the register contents during successive clock cycles, the serial outputs of the shift registers 630a through 630n control the burst generators during each time slot. The serial outputs of a shift register may comprise a single signal turning the attached burst generator on or off, or may comprise multiple signals that control the attached burst generator in further ways, such as determining its phase and/or amplitude, or other characteristics of the burst generator. After transmitting a cluster, the shift register outputs are configured such that they deactivate the attached burst generators until newly loaded with the next cluster. This can be achieved by shifting in a constant value, such as 0, which deactivates the burst generators, or by increasing the length of the shift register by one stage to load a terminal value that deactivates the burst generators. Controller 650 controls the emission of a cluster by asserting and deasserting the load signal and providing clock pulses to the shift registers at the appropriate times.

To transmit data, data input signals 610 are supplied to the inputs ($x_a$ ... $x_m$) of encoder 620 and the enable signal of the control block 650 is asserted. Encoder 620 then encodes the input into a set of burst generator control signals ($d_{aa}$ ... $d_{pp}$), for example, according to a scheme such as illustrated in FIG. 3. Control signal $d_{ik}$ will be loaded into shift register k and will control burst generator k during time slot i. Depending on the burst generators, $d_{ik}$ may comprise a single bit to activate and deactivate the burst generation, or may consist of multiple bits, e.g. to control the amplitude or the polarity of the generated frequency burst.

Referring to FIG. 6, controller 650 generates the shift register load/shift signal as well as the time slot clock for the required number of cycles given by the number of time slots. By asserting the load signal attached to the shift registers 630a through 630n, and providing a clock pulse, controller 650 causes the shift registers to load outputs $d_{aa}$ through $d_{pn}$ of encoder 620. Control signals $d_{aa}$ through $d_{an}$ appear at the serial output of the shift registers 630a through 630n first and control the burst generators during the first time slot. After loading the shift registers, controller 650 deasserts the load signal, causing the shift registers 630a through 630n to shift the loaded data upon receiving clock pulses from controller 650. The controller then generates p–1 additional clock pulses to shift out the remaining control signals $d_{ba}$ through $d_{pn}$ stored in the shift registers. Each clock pulse marks the start of a new time slot.

It will be understood by persons skilled in the art that controlling the shifting of the shift register by means of providing clock pulses is but one embodiment. Other embodiments, such as embodiments using an explicit shift signal to control shifting while providing clock pulses continuously, are equally possible.

Encoder 620 can be implemented using a Random Access Memory (RAM), a Read-Only Memory (ROM), or a programmable ROM such as an Electrically Erasable Programmable ROM (EEPROM) addressed by the data input ($x_a$ through $x_m$). Alternatively, the encoder can be implemented as a combination of logic gates (combinational logic) whose inputs are the data input ($x_a$ through $x_m$) or by any other method known in the art. The number of data input bits (m) varies with the chosen encoding, the number of time slots (p), and the number of frequency bands (n). The number of output bits ($d_{aa}$ through $d_{pn}$) in one embodiment is the product of p and n.

In the preferred embodiment, encoder 620 is implemented such that it can be reconfigured during operation. For example, an embodiment using RAM allows the transmitter 600 to be reconfigured to use a different cluster encoding, a reduced number of burst generators, and/or a reduced number of time slots. This enables transmitter 600 to adapt to interference, for example, by avoiding the use of the frequency bands subject to interference, or to provide different data rates at different times or under different conditions.

Controller 650 is preferably implemented as a finite state machine using combinational logic gates and state registers, but other means known in the art, such as a processor and memory, are equally applicable.

Figure 7:
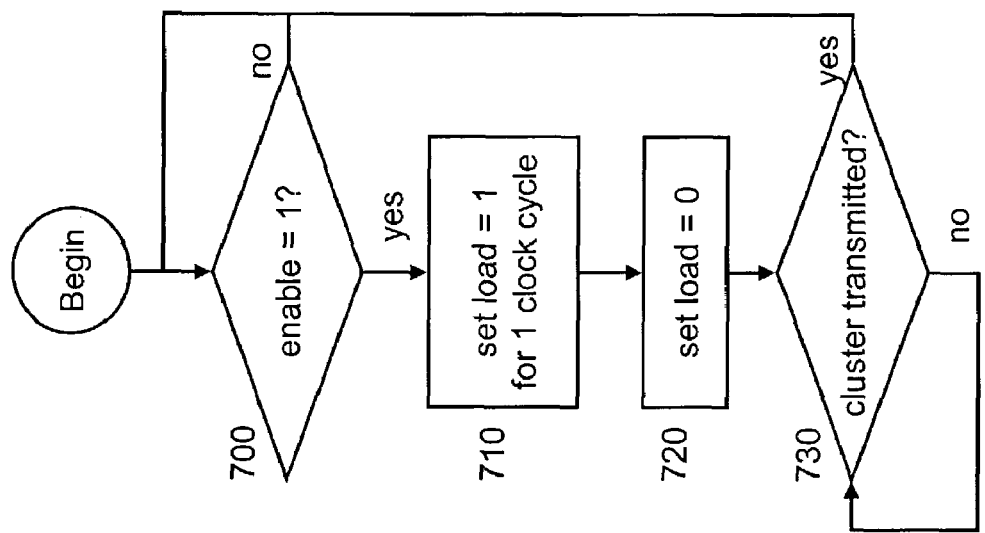
FIG. 7 shows a flow diagram for controlling trigger generator 600 shown in FIG. 6.

FIG. 7 shows a control flow diagram for controller 650 in FIG. 6. At block 700, controller 650 waits until the enable input is asserted, indicating that a data value is present on the data signal input 610 in FIG. 6. When enable is asserted, the controller advances to block 710, where it asserts the load output, causing the shift registers 630a through 630n to be loaded with the output of the encoder 620. After one clock cycle, the load flag is deasserted at block 720, causing the shift registers to switch from loading mode to shift mode, and the controller advances to block 730 where the controller issues p–1 additional clock cycles. After the cluster is transmitted (p clock cycles later), the controller returns to block 700, awaiting the next data value to be transmitted.

Figure 8:
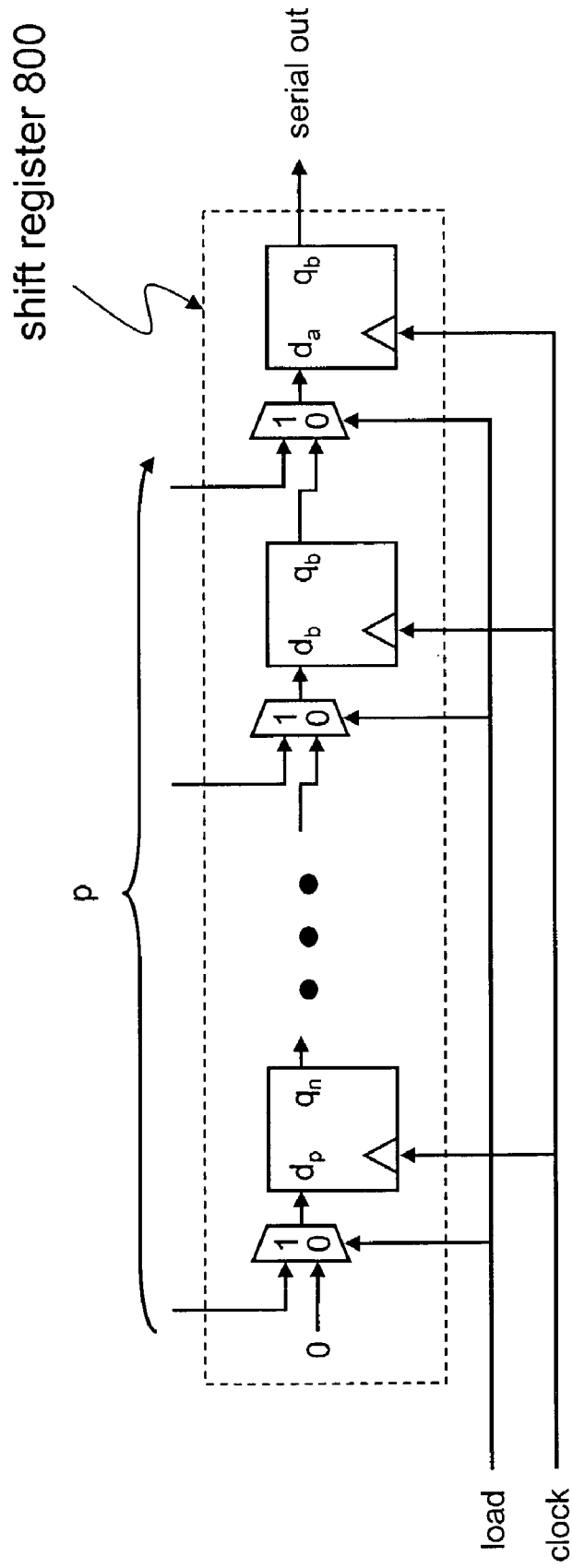
FIG. 8 shows one embodiment of a parallel-to-serial shift register.

The loadable shift registers 630a through 630n in FIG. 6 are implemented as known in the art. FIG. 8 shows one possible implementation of a parallel-to-serial shift register 800. It consists of p pairs of a D flip-flop and a preceding multiplexer. The shift register 800 is loaded by asserting the load signal and providing a clock pulse, whereupon each D flip-flop is loaded with one of the p inputs. Deasserting the load signal and providing subsequent clock pulses causes the loaded values to be shifted to the right while a 0 value into the left-most D flip-flop.

TABLE 1 shows an example of an encoding table according to one embodiment. For this example, it is assumed that a control bit with value 1 causes the corresponding burst generator to emit a frequency burst and that a control bit with value 0 causes it not to emit a burst. It is assumed that during each time slot exactly one burst generator emits a frequency burst and that a burst generator emits only one frequency burst during a cluster (such as in cluster 114 of FIG. 3). It should be understood that this is only one possible method to encode data values and that both the encoding table may vary as well as the way in which the burst generators are controlled.

TABLE 1

| Data | $x_2 \ldots x_0$ | Time Slot 0 $d_{02} \ldots d_{00}$ | Time Slot 1 $d_{12} \ldots d_{10}$ | Time Slot 2 $d_{22} \ldots d_{20}$ |
|---|---|---|---|---|
| 0 | 000 | 100 | 010 | 001 |
| 1 | 001 | 010 | 100 | 001 |
| 2 | 010 | 100 | 001 | 010 |
| 3 | 011 | 001 | 100 | 010 |
| 4 | 100 | 010 | 001 | 100 |
| 5 | 101 | 001 | 010 | 100 |

As a result of these assumptions, there are n! possible data values with n burst generators, or 6 distinct clusters using n=3 burst generators as shown in TABLE 1. Each of the 6 data values is presented to the encoder as a binary number of m=3 bits ($x_2 \ldots x_0$). The encoder produces control signals for each burst generator k in time slot i. There are p=3 time slots. These control signals $d_{ik}$ are stored in the shift register. For example, to encode the data value 3, burst generator 0 emits a frequency burst during time slot 0, burst generator 2 emits a burst during time slot 1, and burst generator 1 emits a burst during time slot 2.

Figure 9:
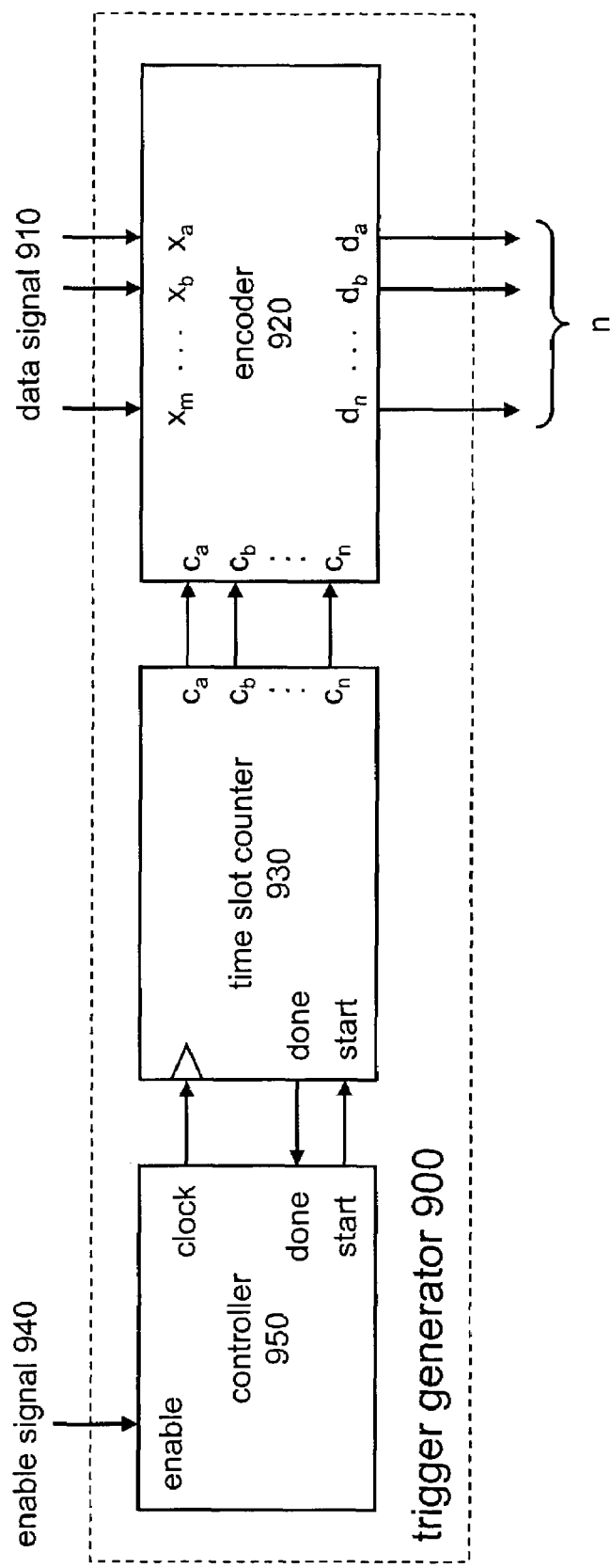
FIG. 9 shows an alternative embodiment of a trigger generator using an encoder and a time slot counter to control burst generators.

FIG. 9 shows an alternative embodiment of a trigger generator. Trigger generator 900 comprises an encoder 920 coupled to a time slot counter 930, and a controller 950 controlling time slot counter 930. Encoder 920 outputs $d_a$ through $d_n$ are coupled to the burst generators inputs and control the burst generators' operation.

To transmit a data value, the data value is provided to encoder 920 through data signal 910 and the enable signal 940 is asserted. The data value is provided to the encoder for the duration of the cluster, generally p time slots. Upon assertion of the enable input, controller 950 asserts the start signal for one clock cycle. Time slot counter 930, upon determining its start input signal asserted, counts for p clock cycles. After counting for p cycles, time slot counter 930 asserts the done signal, signaling to controller 950 that counting has terminated. The values counter 930 assumes, corresponding to the current time slot number, are provided to encoder 920 as r bits.

Encoder 920 uses data signal input 910 and the current value of time slot counter 930 to determine the control signals for the n burst generators attached to the encoder outputs $d_a$ through $d_n$ for the time slot defined by the value of the time slot counter 930.

Encoder 920 can be implemented using a Random Access Memory (RAM), a Read-Only Memory (ROM), or a programmable ROM such as an Electrically Erasable Programmable ROM (EEPROM) addressed by the data input ($x_a$ through $x_m$) and the time slot counter value ($c_a$ through $c_r$). Alternatively, the encoder can be implemented as a combination of logic gates (combinational logic) whose inputs are the data input ($x_a$ through $x_m$) and the time slot counter value ($c_a$ through $c_r$), or any other way known in the art. The number of data input bits (m+r) varies with the chosen symbol encoding, the number of time slots (p), and the number of frequency bands (n). The number of counter output bits r is given by the formula $\lceil \log_2 (p) \rceil$. The number of output bits in one embodiment is the number of burst generators n. Depending on the burst generators, $d_{ik}$ may comprise a single bit to activate and deactivate the burst generation, or may consist of multiple bits, e.g. to control the amplitude or the phase of the generated frequency burst.

In the preferred embodiment, encoder 920 is implemented such that it can be reconfigured during operation. For example, an embodiment using RAM allows transmitter 900 to be reconfigured to use a different cluster encoding, a reduced number of burst generators, and/or a reduced number of time slots. This enables transmitter 900 to adapt to interference, for example, by avoiding use of the frequency bands subject to interference, or to provide different data rates at different times or under different conditions.

Controller 950 in FIG. 9 is preferably implemented as a finite state machine using combinational logic gates and state registers, but other means known in the art, such as a processor and memory, are equally applicable.

Figure 10:
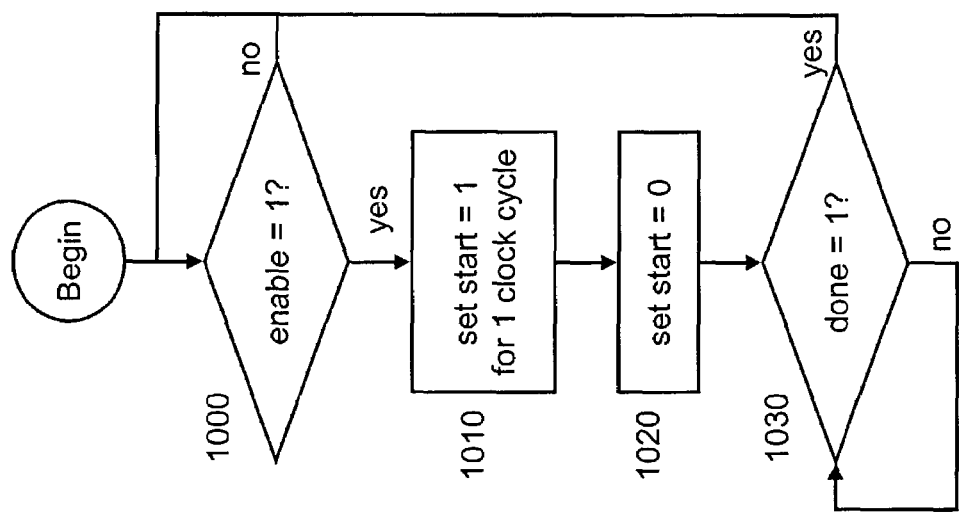
FIG. 10 shows a flow diagram for controlling trigger generator 900 shown in FIG. 9.

FIG. 10 shows a control flow diagram for controller 950 in FIG. 9. At block 1000, the controller waits for the enable input to be asserted. Once it is asserted, control advances to block 1010, where the controller asserts the start output. After one clock cycle, controller 950 deasserts the start output at block 1020 and continues at block 1030. There, the controller waits until time slot counter 930 asserts its done output, indicating the cluster has been transmitted. Once done is asserted, controller 950 continues at block 1000 waiting for the next data item to transmit.

Figure 11:
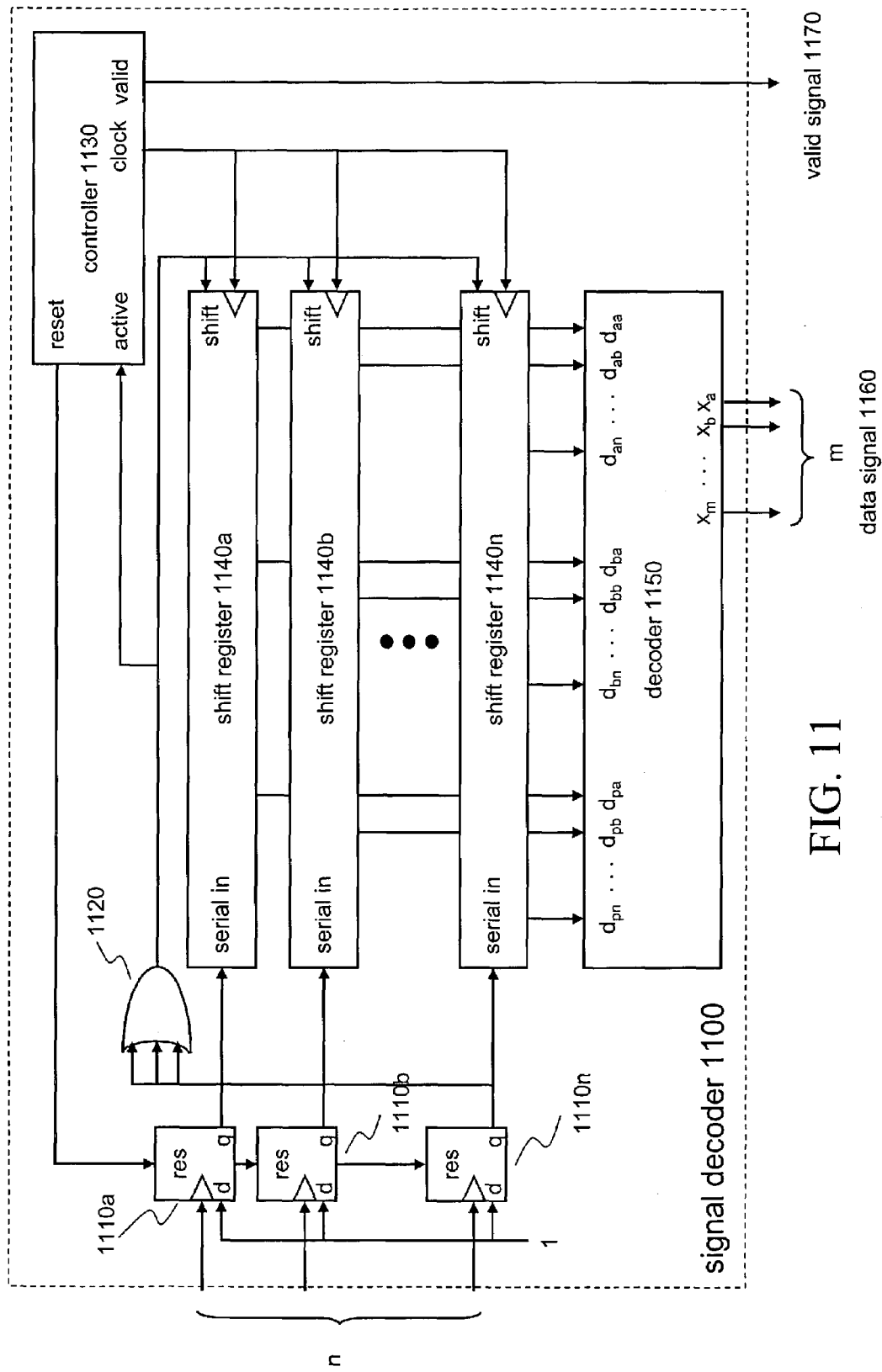
FIG. 11 shows an embodiment of a signal decoder using detector capture registers, serial-to-parallel shift registers and a decoder.

Referring to FIG. 11, signal decoder 1100 comprises detector capture registers 1110a through 1110n, a start of cluster detector 1120, a controller 1130, shift registers 1140a through 1140n, and a decoder 1150. The burst detectors 530a through 530n in FIG. 5 sense the communication channel and detect frequency bursts in their respective detector band. They present the state of the channels on their outputs, which are coupled to the detector capture registers 1110a through 1110n in FIG. 11. The detector capture registers are implemented as one shot registers and are set the first time the attached burst detectors sense a frequency burst. They are reset by controller 1130. When activated by the controller, the shift registers 1140a through 1140n capture the state of the detector capture registers 1110a through 1110n during each time slot. Simultaneously, they present the captured states ($d_{aa}$ through $d_{pn}$) to decoder 1150. The decoder determines the received symbol given the detector states $d_{aa}$ through $d_{pn}$ as inputs. Controller 1130 generates the time slot clock, signals the decoding of a data value to the consumer of the received data, and clears the detector capture registers prior to receiving the next symbol.

Reception begins when one of the burst detectors 530a through 530n senses a frequency burst in its respective band, causing the output of the detector capture register (one of 1110a through 1110n) connected to the burst detector to go high. This causes the output of the start of cluster detector 1120 to go high, enabling the shifting of serial input data into the shift registers 1140a through 1140n. It also triggers the controller 1130, which then provides the shift registers with a time slot clock for the duration of the cluster (p cycles). At the end of a cluster, controller 1130 resets the detector state registers, stopping further shifting of the detector state into the shift register and stops the time slot clock. The outputs of shift registers 1140a through 1140n are presented to decoder 1150, which, based on this input, determines the received symbol and presents it on the decoder outputs $x_a$ through $x_m$. Controller 1130 asserts the valid signal output in parallel with the decoder output to indicate that a new data value is available. Prior to the reception of the next cluster, controller 1130 resets the detector state registers to enable reception of another symbol.

The detector capture registers 1110a through 1110n are implemented in any way known in the art to be asynchronously set upon a signal by the pulse detectors and to be synchronously or asynchronously reset by controller 1130. Examples include RS flip-flops or D flip-flops whose clock inputs are connected to the pulse detector state output.

Decoder 1150 can be implemented using a RAM, a ROM, or a programmable ROM such as an EEPROM addressed by the shift register stage outputs. Alternatively, the decoder can be implemented as a combination of logic gates (combinational logic) whose inputs are the shift register stage outputs. The number of decoder inputs is generally the number of time slots p times the number of frequency bands n times the number of bits provided by the burst detectors. Preferably, the decoder is implemented such that it can be reconfigured at runtime. This enables the transmitter and receiver subsystems to adapt to interference by changing their data encoding, for example, by avoiding bands that contain interfering signals.

Controller 1130 is preferably implemented as a finite state machine using combinational logic gates and state registers, but other means known in the art, such as a processor and memory, are equally applicable.

Figure 12:
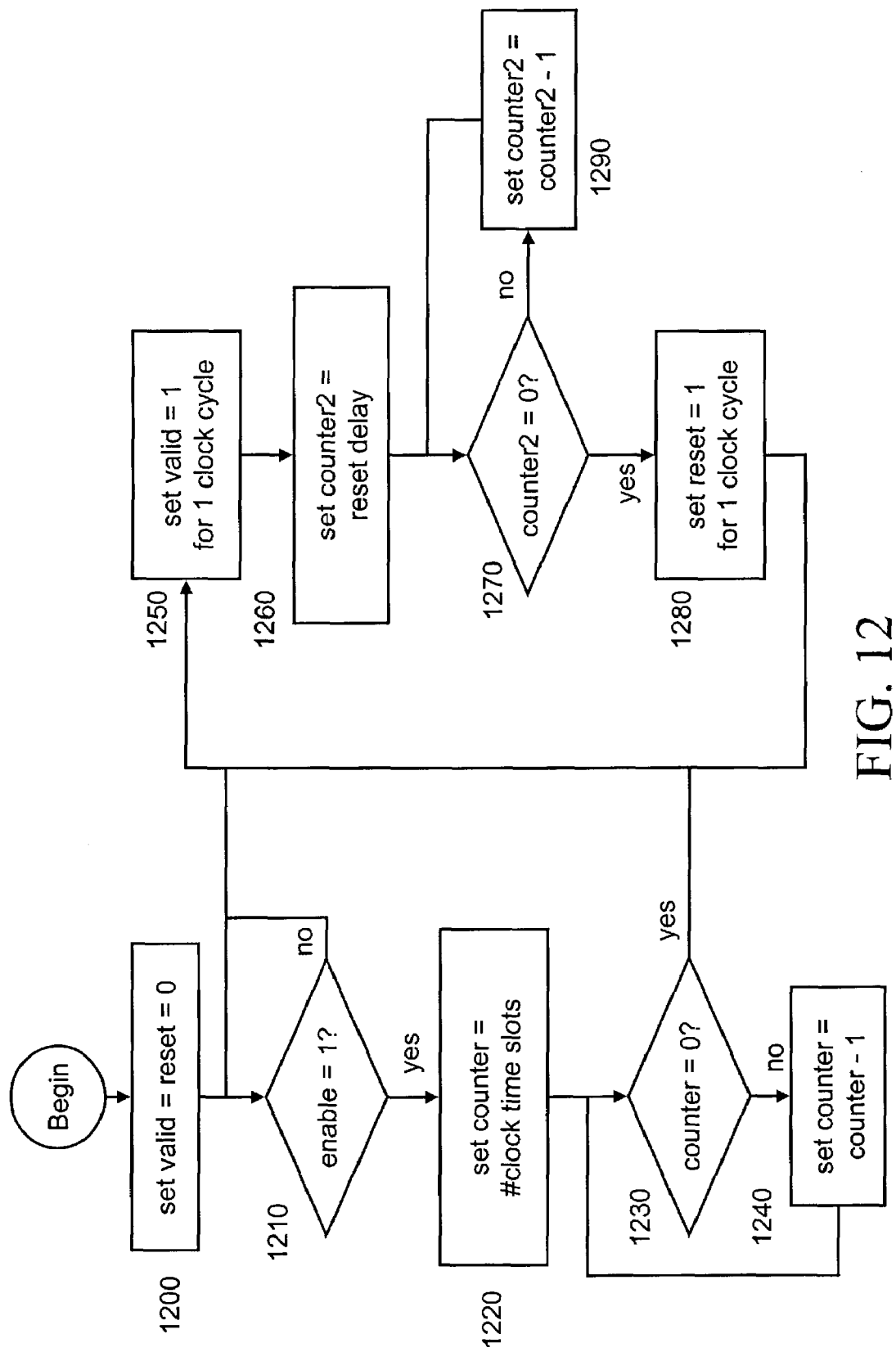
FIG. 12 shows a flow diagram for controlling signal decoders 1100 and 1400 shown in FIG. 11 and FIG. 14, respectively.

FIG. 12 shows a control flow diagram for controller 1130. At block 1200, the controller initializes itself and then advances to block 1210. There, it waits for the start of cluster detector to indicate an incoming cluster. When an incoming cluster is detected, the controller advances to block 1220. There, it initializes the time slot counter to the number of time slots p and then enters into block 1230. At block 1230, the controller tests if the time slot counter has completed counting the number of slots of one cluster, and, if so, advances to state 1250. Otherwise, the controller decrements the time slot counter in block 1240, provides a clock pulse to the shift registers and reenters block 1230. At block 1250, the controller asserts the valid signal 1170 for one clock cycle to indicate that a complete cluster has been received and its decoded data value is present on the output of decoder 1150. The controller then proceeds to block 1260, where it initializes a delay counter. In block 1470, the counter is compared to zero to determine if the delay time has been reached. The delay length corresponds to about the interval between successive clusters minus the length of a cluster and serves to prevent early triggering due to interference. If the counter has not yet reached zero, it is decremented in block 1290 before reentering block 1270. When the counter reaches zero, the controller resets the detector capture registers 1110a through 1110n in block 1280 to prepare for the arrival of the next cluster.

Figure 13:
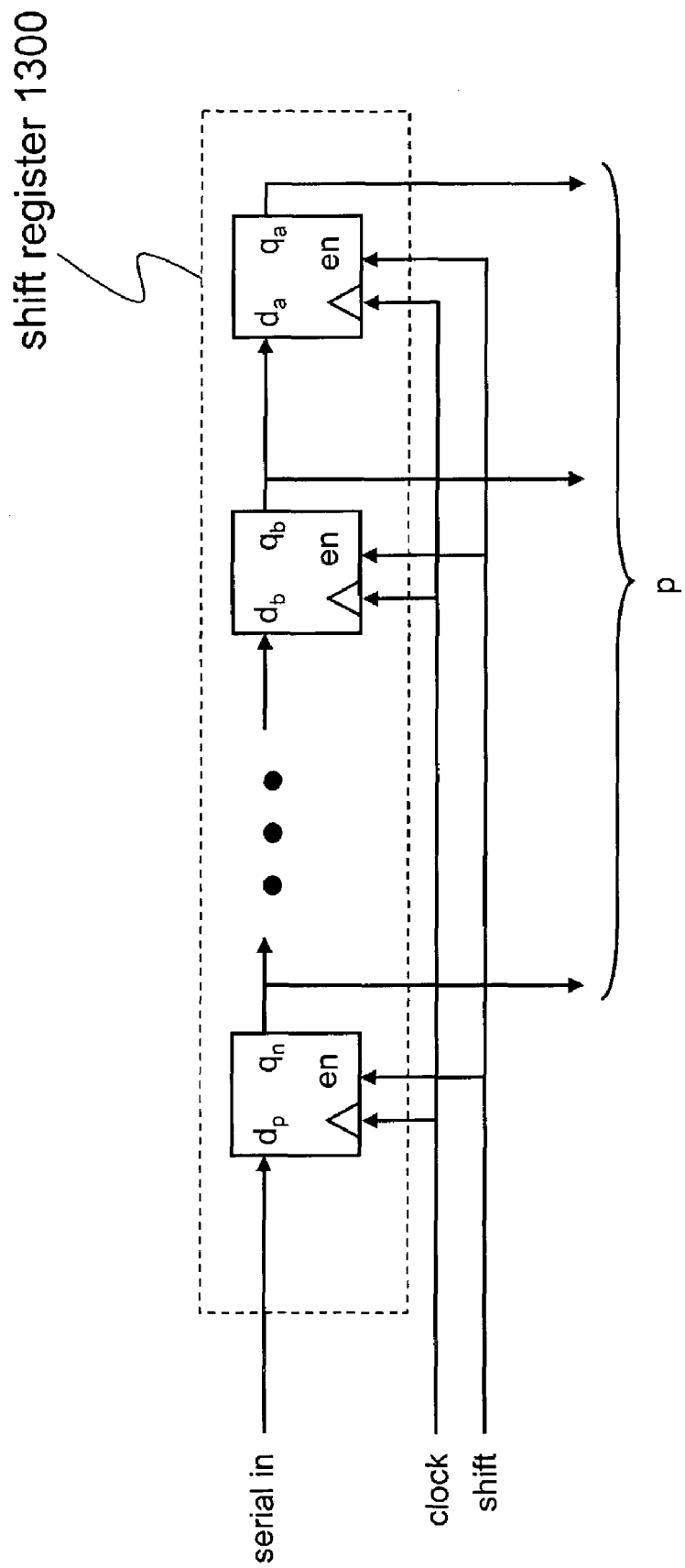
FIG. 13 shows an embodiment of a serial-to-parallel shift register.

The serial-to-parallel shift registers 1140a through 1140n are implemented as known in the art. FIG. 13 shows a common implementation. The shift register consists of p D flip-flops connected in series. The input of the leftmost flip-flop is connected to the output of the detector capture register. The shift input connected to the output of the start of cluster detector 1120 causes data to be shifted in when controller 1130 provides the time slot clock. The outputs of the shift register are connected to decoder 1150. The number of shift register stages and the number of bits varies with the chosen symbol encoding and the number of pulse detectors as well as the number of outputs provided by the burst detectors. For example, the burst detectors may provide amplitude information stored in multiple bits instead of a single bit indicating presence or absence of a burst.

Controller 1130 is preferably implemented as a finite state machine using combinational logic gates and state registers, but other means known in the art, such as a processor and memory, are equally applicable.

Figure 14:
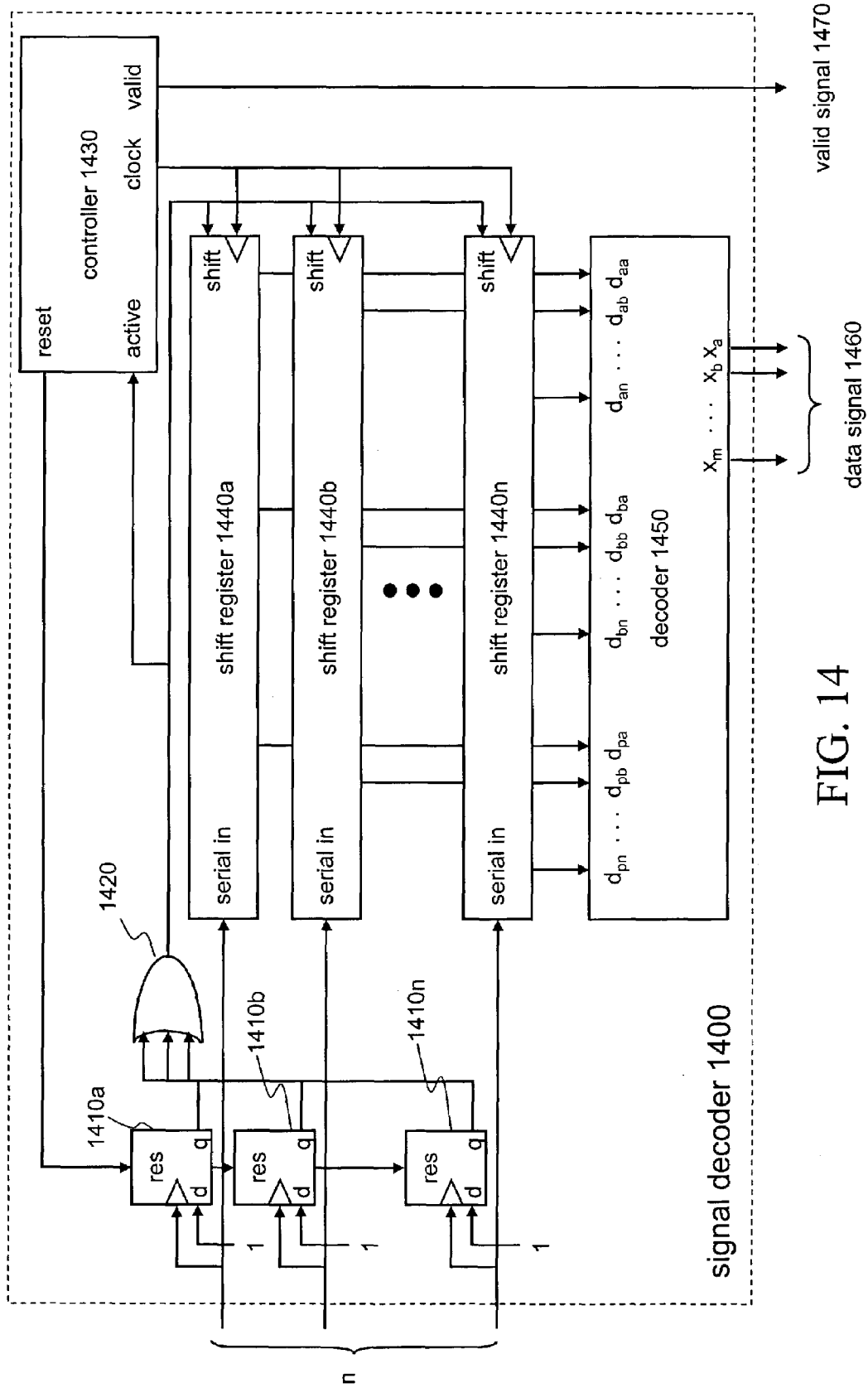
FIG. 14 shows an alternative embodiment of a signal decoder.

FIG. 14 shows an alternative embodiment of signal decoder 1100 shown in FIG. 11. Signal decoder 1400 comprises detector capture registers 1410a through 1410n, a start of cluster detector 1420, a controller 1430, shift registers 1440a through 1440n and a decoder 1450. Burst detectors 530a through 530n in FIG. 5 sense the communication channel and detect frequency bursts in their respective frequency bands. The burst detectors present the state of the channels on their outputs, which are coupled to the serial inputs of shift registers 1440a through 1440n and also to the inputs of detector capture registers 1410a through 1410n in FIG. 14. The detector capture registers are implemented as one shot registers and are set the first time the attached burst detectors sense a frequency burst. They are reset by controller 1430. When activated by the controller by providing clock pulses, the shift registers 1440a through 1440n capture the state of the burst detectors 530a through 530n shown in FIG. 5 during each time slot. Simultaneously, they present the captured states ($d_{aa}$ through $d_{pn}$) to decoder 1450 by means of the parallel outputs of the shift registers. The decoder determines the received symbol given the detector states $d_{aa}$ through $d_{pn}$ as inputs. Controller 1430 generates the time slot clock, signals the decoding of a data value to the consumer of the received data, and clears the detector capture registers prior to receiving the next symbol.

Reception begins when one of the burst detectors 530a through 530n senses a frequency burst in its respective band, causing the output of the detector capture register (one of 1410a through 1410n) connected to the burst detector to go high. This causes the output of the start of cluster detector 1420 to go high, enabling the shifting of serial input data into the shift registers 1440a through 1440n. It also triggers the controller 1430, which then provides the shift registers with a time slot clock for the duration of the cluster (p cycles). At the end of a cluster, controller 1430 resets the detector state registers, stopping further shifting of the detector state into the shift register and stops the time slot clock. The outputs of shift registers 1440a through 1440n are presented to decoder 1450, which, based on this input, determines the received symbol and presents it on the decoder outputs $x_a$ through $x_m$. Controller 1430 asserts the valid signal output in parallel with the decoder output to indicate that a new data value is available. Prior to the reception of the next cluster, controller 1430 resets the detector state registers to enable reception of another symbol.

Whereas the embodiment of signal detector 1100 shown in FIG. 11 only detects the first occurrence of a burst in frequency band, signal detector 1400 captures the state of the burst detector during each time slot, thus enabling a broader range of cluster encodings to be used, for example, a cluster encoding scheme where more than 1 burst per/cluster is transmitted in a given frequency band.

According to several embodiments of the present invention, methods are provided for detecting when a cluster has been decoded in error for a particular method of cluster coding.

Figure 15:
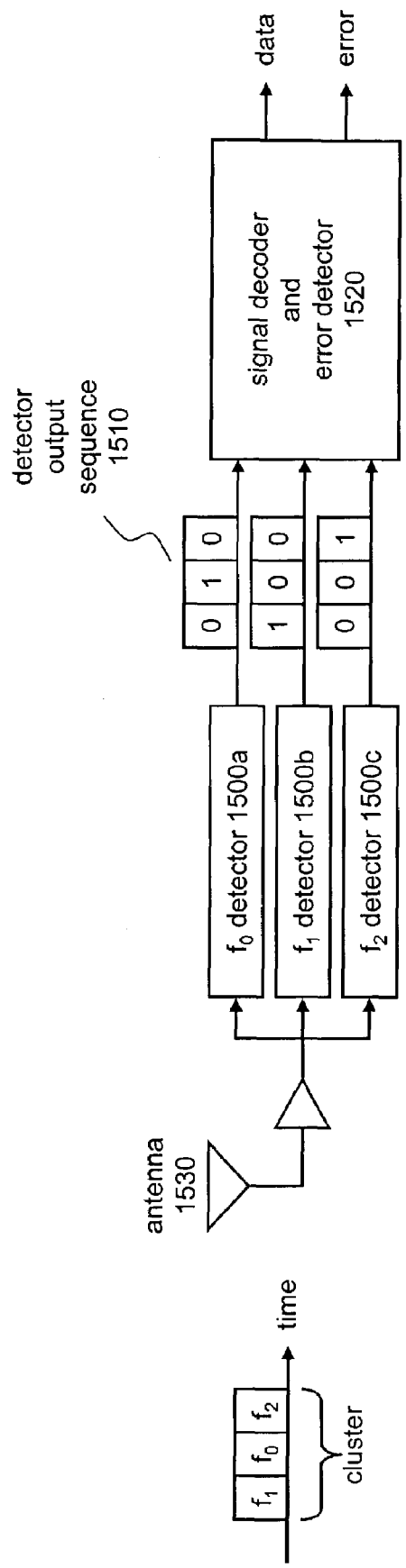
FIG. 15 shows an example of the output of burst detectors during reception of a cluster.

One type of detector, which can be used to decode a particular embodiment of cluster encoding in which a burst occurs in a frequency band at most once per cluster, uses an independent decision as to the frequency of each individual burst as it passes through the burst detector. FIG. 15 shows an example of this detector in block diagram form. A cluster consisting of three bursts with frequencies $f_1$, $f_0$, $f_2$, in that order, enters the receiver through antenna 1530. The received signal passes through three separate burst detectors 1500a through 1500c and each detector independently declares the existence of a burst in its associated frequency band during each time slot. In the example of FIG. 15, each detector 1500 correctly declares the presence (indicated by an output value of 1) or absence (indicated by an output value of 0) of the particular frequency burst, as shown in the detector output sequence 1510. According to one embodiment of the present invention, a means for detecting when one or more of the individual frequency detectors makes an error is provided.

Figure 16:
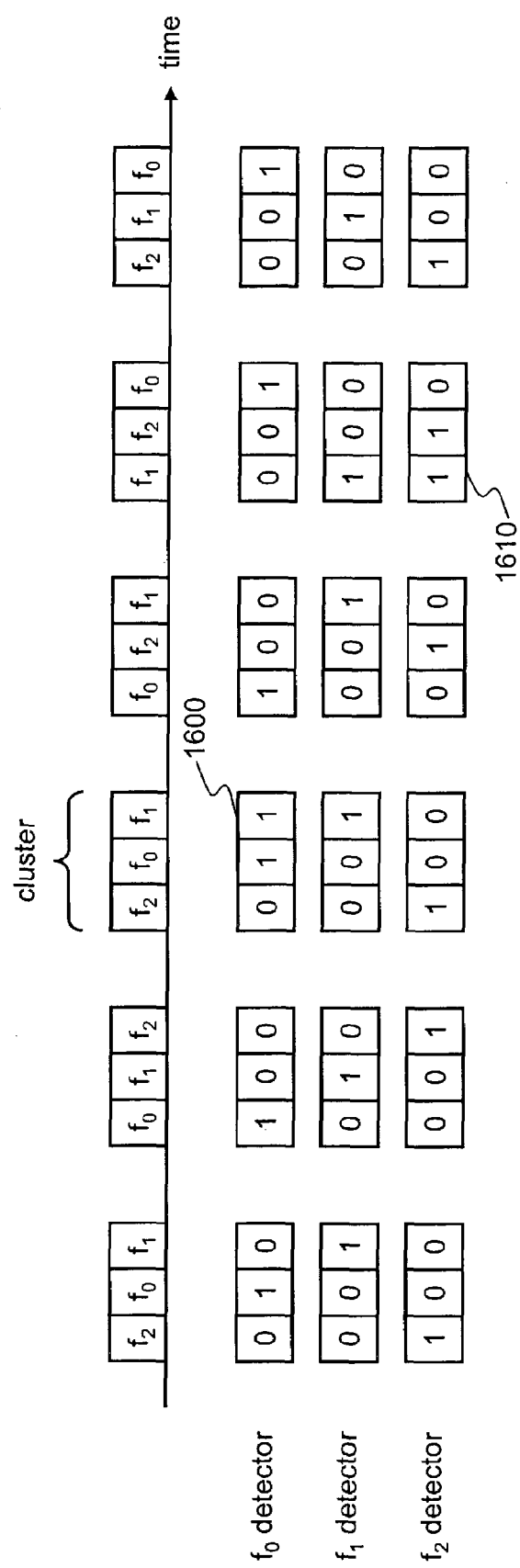
FIG. 16 shows a sequence of clusters and the corresponding output of burst detectors.

FIG. 16 illustrates an example sequence of transmitted clusters and example outputs from the three individual burst detectors of FIG. 15 for the illustrated clusters. In the defined signaling method, each frequency can be used at most once per symbol. That is, generically, each frequency must be used a specified number of times per symbol (i.e., once, in this embodiment). Therefore, if an individual detector declares the existence of a particular frequency more than once (i.e., more than the specified number of times), the detection must be in error. For the third cluster defining the third symbol, for example, the $f_1$ and $f_2$ detectors 1500 have correctly declared the existence of the $f_1$ and $f_2$ frequency bursts in the appropriate time slots, but the $f_0$ detector has declared the existence of the $f_0$ burst at both the second and third time slots (see 1600 in FIG. 16). The existence of multiple detections of the same frequency can be used to declare the received symbol to be invalid. Similarly, the declarations for the fifth symbol show that the frequency $f_2$ is declared twice, so this detection is in error (see 1610 in FIG. 16).

This is illustrated in FIG. 15, where the data output of the decoder is combined with the output of the error detector and where the latter declares whether the value on the data signal is valid or not. If the data is tagged as invalid, the entity connected to the signal decoder 1520 may take appropriate action such as requesting retransmission by the transmitter.

One way to implement this signaling method, is to use signal decoder 1400 in FIG. 14, with the length p of shift registers 1440a through 1440n equal to the number of frequency bands n.

Figure 17:
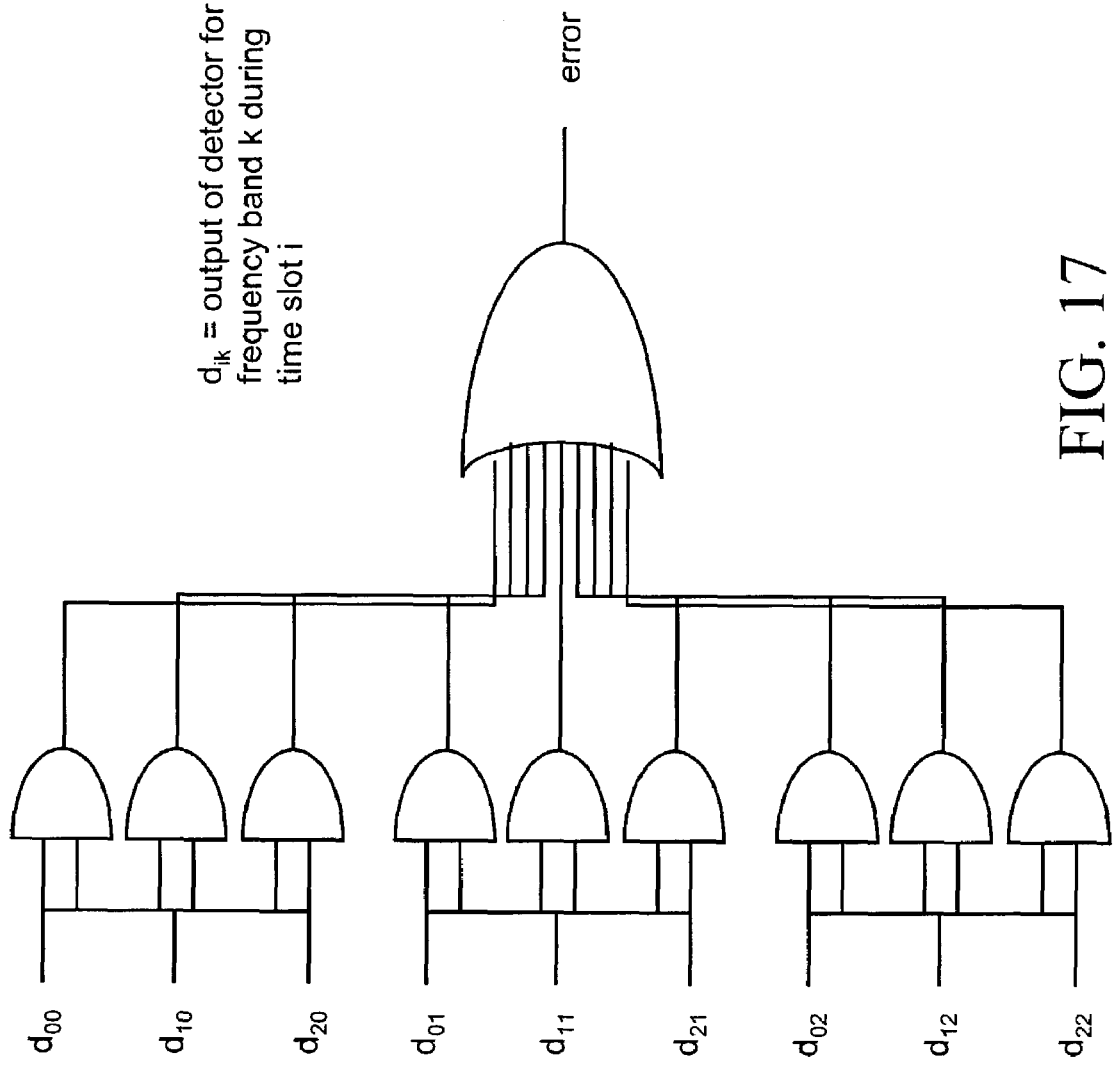
FIG. 17 shows an embodiment to detect transmission errors, where each cluster comprises a burst in a particular frequency band at most once.

FIG. 17 shows an example of an implementation for three frequency bands with logic gates, where the term $d_{ik}$ refers to the output of burst detector for frequency band k during time slot i. For each frequency band, if a detector detects a burst during any pair of time slots, then the AND gate associated with that pair produces an output value 1. A bad cluster will thus produce an output value 1 (signaling an error) when the outputs of the AND gates shown are combined through an OR gate. This decoder implementation allows coding in which a burst occurs in each frequency band at most once per cluster.

If the coding scheme mandates that a burst occur in each frequency band exactly once per cluster, the error detector shown in FIG. 17 may be augmented with another term per frequency band. In addition to the gates ensuring that at most one burst occur in a valid cluster per frequency band, another gate ensures that at least one burst occur in a valid cluster per frequency band. This can be achieved by combining the outputs of a burst detector during all (3) time slots through a NOR gate whose output feeds into the OR gate in FIG. 17. For the given example of three frequency bands, three terms NOR ($d_{00}$, $d_{10}$, $d_{20}$), NOR ($d_{01}$, $d_{11}$, $d_{21}$) and NOR ($d_{02}$, $d_{12}$, $d_{22}$) are added.

The error detector implementation shown in FIG. 17 can be implemented in alternative embodiments, such as lookup tables implemented in ROM, RAM, EEPROMS or any other method known in the art.

It is noted that in other embodiments, the method of error detection provided in FIGS. 15–17 may be modified to apply to transmission schemes other than a scheme requiring only one burst per frequency band per cluster. In a generic example, in a given transmission encoding scheme requiring that a burst is transmitted in each frequency band a specified number of times per cluster (e.g., 2 bursts per frequency band per cluster) in order to encode a symbol mapping to data. In such an embodiment, the burst detectors (e.g., burst detectors 1500) produce detector output sequences that are input to the signal decoder and error detector 1520. If the error detector 1520 determines that a given burst is detected as not having been transmitted the specified number of times in the given frequency band during the cluster, then the error detector declares the symbol in error. For example, if a burst was detected less than the specified number of times (e.g., detected once), the symbol is declared in error. Similarly, if a burst was detected more than the specified number of times, (e.g., detected three times), the symbol is declared in error. Such variations of the error detection technique can easily be implemented in shift registers or logic gates, such as illustrated in FIGS. 14 and 17.

In further embodiments according to the present invention, further methods are provided for decoding information contained in another embodiment of a cluster encoding, in which a cluster contains at most one frequency burst per time slot. The method described in the following enables the signal decoder to be resilient against effects of multipath, which can cause bursts emitted by the transmitter during a single time slot to appear extended across several time slots at the receiver.

Figure 18:
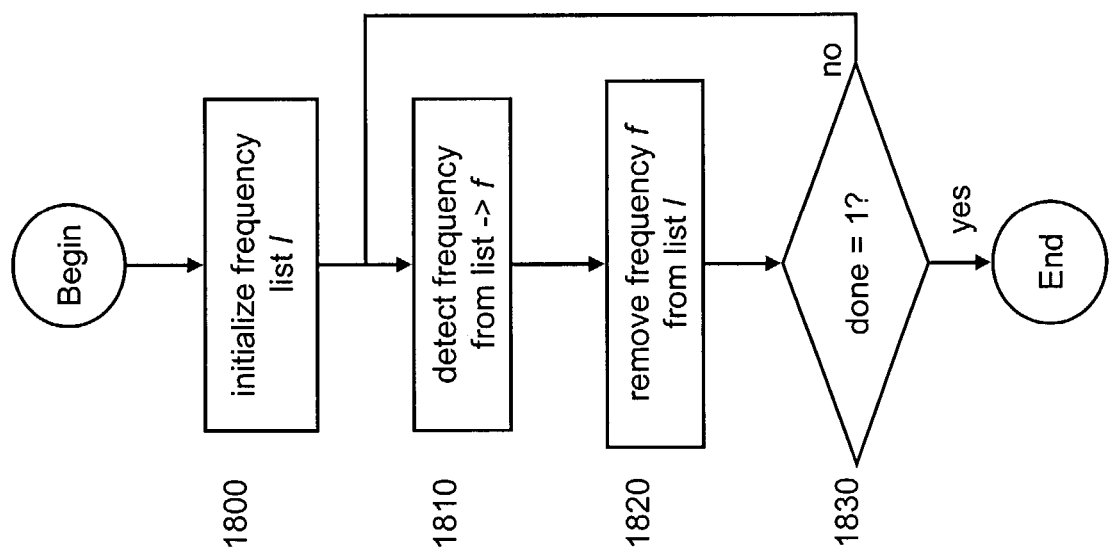
FIG. 18 shows a flow diagram for decoding clusters

To decode a cluster, apply the algorithm described in FIG. 18. Initialize frequency list 1 with the set of all frequency bands as shown in block 1800. In the first time slot, detect the prominent frequency f at block 1810, where prominence can be based on the amplitude of the detected frequency bursts or any other characteristics known in the art to select the strongest among several signals. At block 1820, remove the detected frequency f from the frequency list 1. Repeat steps 1810 and 1820 until all frequencies have been removed from the frequency list 1, or the maximum number of time slots per cluster has been reached. The time slot at which each frequency was removed from the list determines the data value encoded by the cluster.

Figure 19:
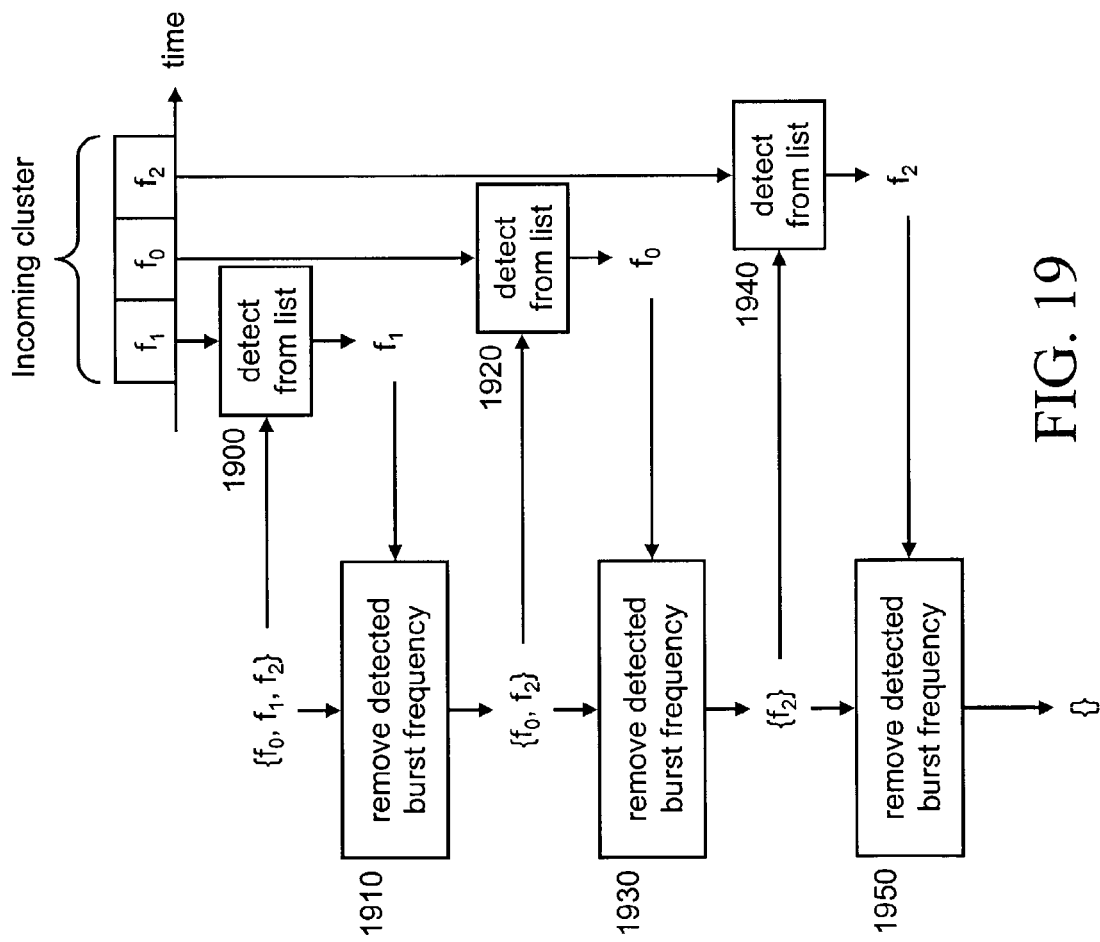
FIG. 19 shows an example of decoding a cluster with three bursts.

FIG. 19 shows an example of this algorithm in block diagram form for a coding method in which the transmitter emits a burst in each frequency band exactly once per cluster and emits a burst in each time slot of a cluster. In the example, a cluster consisting of three frequencies $f_2$, $f_0$, $f_1$, in that order, enters the detector. The blocks labeled "Detect from List" (blocks 1900, 1920 and 1940) represent a detection decision at each time slot, corresponding to block 1810 in FIG. 18. In this detection, a decision statistic is generated corresponding to each frequency band $f_k$ in the list at the left of FIG. 19. For example, this statistic may be the maximum amplitude of the signal envelope, which has passed through the filter centered at frequency $f_k$, or it may be the amplitude generated by correlation of the input signal with a sinusoidal signal having frequency $f_k$. The maximum value of these detection statistics defines the frequency which is declared for that time slot. In the example shown in the figure, the frequency $f_1$ is detected first in step 1900, and then removed from consideration for the next detection in step 1910. The frequency $f_0$ is detected next in step 1920, and then removed from consideration in step 1930. Finally, only the frequency $f_2$ remains to be detected and removed in steps 1940 and 1950. The detection statistic for $f_2$ can be compared with a threshold to verify the presence of that frequency as a means of error detection. If the decision statistic does not exceed the threshold, the cluster is declared to be in error.

Figure 20:
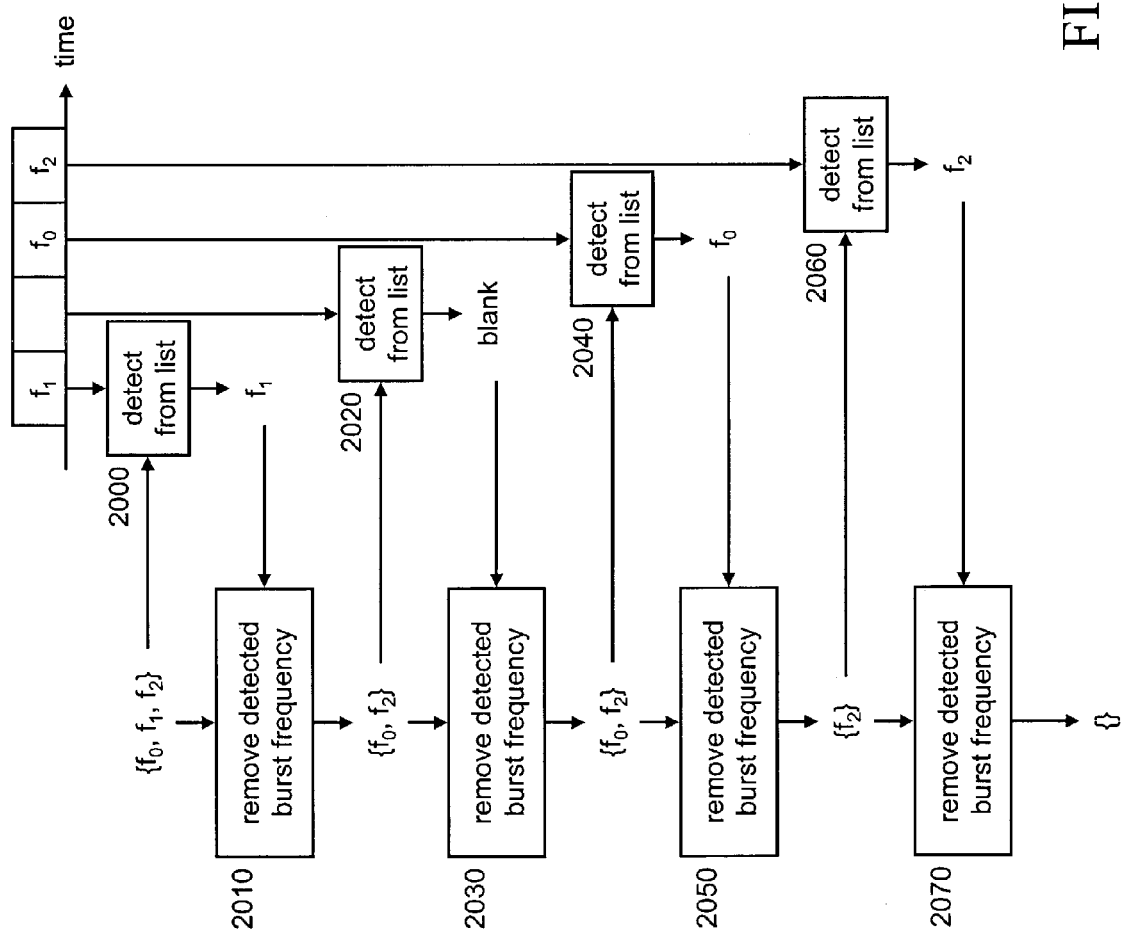
FIG. 20 shows an example of decoding a cluster with three bursts and one time slot without burst.

FIG. 20 shows an example of this algorithm in block diagram form for a coding method, where each frequency is present during no more than one time slot per cluster. In the example, a cluster represented by the sequence $f_1$, blank, $f_0$, $f_2$, in that order, enters the detector. The blocks labeled "Detect from List" (e.g., blocks 2000, 2020, 2040, 2060) in FIG. 20 represent detection similarly to the description of FIG. 19 except that each detection statistic must also exceed a specified threshold before the declaration is made that a particular time slot contains a burst of a particular frequency. In the example shown in the FIG. 20, the frequency $f_1$ is detected first in step 2000, then removed from consideration for the next detection in step 2010. In the next time slot, none of the detection statistics corresponding to the three frequencies exceeds the specified threshold, so a "blank" is declared in step 2020. Since no frequency was detected, the list of possible frequencies is not diminished prior to the next time slot in step 2030. The frequency $f_0$ is detected next in step 2040, then removed from consideration in step 2050. Finally, the frequency $f_2$ is detected in step 2060 and removed in step 2070 leaving an empty set of candidate frequencies.

In the described first embodiment, the frequencies are removed sequentially, as parts of a cluster arrive at the detectors during each time slot. In an alternative embodiment of a signal decoder, an entire cluster is captured first, and the frequencies are removed in parallel using a decoder table. Embodiments of this variation of decoder are shown in FIG. 11 and FIG. 14. In this case, the length of shift registers 1140a through 1140n is p with the number of frequency detectors equal to n<=p. An example of decoder table is given in TABLE 2. It allows the decoding of clusters where a burst occurs exactly once per cluster and there are no time slots during which no burst is emitted by the transmitter (no blanks). A value 'x' for one of the $d_{ik}$ in the table indicates a 'don't care', since the corresponding frequency k was detected in a previous time slot (<i) and is thus considered removed. For example, in the top row, a burst in frequency band $f_2$ is detected during time slot 0 ($d_{02}=1$). In subsequent time slots ($d_{12}$ and $d_{22}$), the table shows a 'don't care', which, in the sequential algorithm, is equivalent to removing $f_2$ from the candidate set of frequencies during time slot 0 and subsequently ignoring $f_2$.

TABLE 2

| Time Slot 0 $d_{02} \ldots d_{00}$ | Time Slot 1 $d_{12} \ldots d_{10}$ | Time Slot 2 $d_{22} \ldots d_{20}$ | $x_2 \ldots x_0$ | Data |
|---|---|---|---|---|
| 100 | x10 | xx1 | 000 | 0 |
| 010 | 1x0 | xx1 | 001 | 1 |
| 100 | x01 | x1x | 010 | 2 |
| 001 | 10x | x1x | 011 | 3 |
| 010 | 0x1 | 1xx | 100 | 4 |
| 001 | 01x | 1xx | 101 | 5 |

It is noted that the decoding methods described with reference to FIGS. 18–20 are performed in several embodiments, by the signal decoder and error detector 1520 of FIG. 15.

The foregoing presentation of the described embodiments is provided to enable any person skilled in the art to make or use the invention as claimed. Various modifications to these embodiments are possible, and the generic principles presented herein may be applied to other embodiments as well. The principles described herein may be applied to communications over wired, wireless, and/or optical transmission channels.

It is further noted that although many of the embodiments described herein are in the context of a multi-band system transmitting and receiving wideband and/or ultra-wideband signaling in multiple wideband and/or ultra-wideband frequency bands, the methods and corresponding apparatus presented herein may be implemented in systems using narrowband signaling. For example, systems using signaling in which the bandwidth of the multiple frequency bands is less than 2%, typically significantly less than 2% of the center frequency of the respective frequency band.

The invention may be implemented in part or in whole as a hard-wired circuit and/or as a circuit configuration fabricated into an application-specific integrated circuit. The invention may also be implemented in part or in whole as a firmware program loaded into non-volatile storage (e.g. ROM or flash or battery-backup RAM) or a software program loaded from or into a data storage medium (for example, a read-only or rewritable medium such as a semiconductor or ferromagnetic memory (e.g. ROM, programmable ROM, dynamic RAM, static RAM, or flash RAM); or a magnetic, optical, or phase-change medium (e.g. a floppy, hard, or CD or DVD disk)) as machine-readable code, such code being instructions executable by an array of logic elements such as a microprocessor or other digital signal processing unit or an FPGA.

In some cases, for example, the design architecture according to an embodiment of the invention may be realized in an integrated circuit device, such as an application-specific integrated circuit (ASIC). Such a design may be implemented as a stand-alone packaged device, or embedded as a core in a larger system ASIC. Features of an architecture according to certain such embodiments of the invention lend themselves well to an ASIC implementation that enables low cost, low power, and/or high volume production. Embodiments of the invention may include designs that are scalable with evolving semiconductor technologies, enabling increased performance objectives and expanded applications. In some cases an entire such architecture may be implemented in a single semiconductor process, although even in these cases it may be possible to transfer the design to multiple semiconductor technologies rather than to depend on a single semiconductor process.

Thus, the present invention is not intended to be limited to the embodiments shown above but rather is to be accorded the widest scope consistent with the principles and novel features disclosed in any fashion herein.

According to several embodiments, the following devices are provided herein. An apparatus comprises: a controller, an encoder, and one or more shift registers. In one variation, said encoder is implemented using a Read-Only Memory (ROM) or other unalterable memory device. In another variation, said encoder is implemented using logic gates. In a further variation, said encoder is implemented using Random Access Memory (RAM) or other alterable memory device. In another variation, said encoder is implemented using reconfigurable logic (such as provided by FPGAs). A corresponding method comprises: encoding a data value, loading one or more shift registers with said encoded value, transmitting encoded value by shifting said shift registers, thereby controlling the emission of multi-band UWB pulses.

An apparatus comprises: a controller, an encoder, and a time slot counter. In one variation, said encoder is implemented using a Read-Only Memory (ROM) or other unalterable memory device. In another variation, said encoder is implemented using logic gates. In a further variation, said encoder is implemented using Random Access Memory (RAM) or other alterable memory device. In another variation, said encoder is implemented using reconfigurable logic (such as provided by FPGAs). A corresponding method comprises: encoding a data value using a time slot counter and a lookup table, and providing encoder output values to burst generators, thereby controlling the emission of multi-band UWB pulses.

An apparatus comprises: a controller, a decoder, detector capture registers, a start of cluster detector, and one or more shift registers. In one variation, said decoder is implemented using a Read-Only Memory (ROM) or other unalterable memory device. In another variation, said decoder is implemented using logic gates. In another variation, said decoder is implemented using Random Access Memory (RAM) or other alterable memory device. In a further variation, said decoder is implemented using reconfigurable logic (such as provided by FPGAs). A corresponding method comprises: receiving encoded data values from a transmitter, capturing the state of burst detectors (or other detectors) in a detector capture register, capturing the state of detector capture registers in one or more shift registers by serially loading them, decoding shift register parallel outputs into data values.

An alternate apparatus comprises: a controller, a decoder, detector capture registers, and a start of cluster detector. In one variation, said decoder is implemented using a Read-Only Memory (ROM) or other unalterable memory device. In another variation, said decoder is implemented using logic gates. In a further variation, said decoder is implemented using Random Access Memory (RAM) or other alterable memory device. In another variation, said decoder is implemented using reconfigurable logic (such as provided by FPGAs). A corresponding method comprises: receiving encoded data values from a transmitter, capturing the state of burst detectors (or other detectors) in one or more shift registers by serially loading them, decoding shift register parallel outputs into data values.

In one embodiment, a trigger generator for a multi-band transmitter comprises: an encoder configured to receive an input data signal, the encoder configured to encode the input data signal into a plurality of control signals to each of a plurality of shift registers, the plurality of control signals encoding a symbol, the symbol corresponding to the input data signal; the plurality of shift registers configured to output a plurality of trigger signals to respective ones of a plurality of burst generators, wherein each of the plurality of shift registers corresponds to a respective burst generator configured to generate bursts occupying a respective one of a plurality of frequency bands; and a controller configured to cause each of the plurality of shift registers to shift the plurality of control signals to be output as the plurality of trigger signals; wherein a bandwidth of at least one of the plurality of bursts is at least two percent of the center frequency of the burst. In different variations, the encoder is implemented in unalterable memory, alterable memory, or as a lookup table.

What is claimed is:

1. A method of error detection comprising:
   receiving a plurality of bursts, each burst occupying at least one of a plurality of frequency bands, the plurality of bursts encoding a symbol, the symbol corresponding to data, wherein the symbol is encoded such that a burst occupying each frequency band is transmitted a specified number of times within the plurality of bursts;
   determining that a given burst has not been detected the specified number of times; and
   declaring a transmission error for the symbol.

2. The method of claim 1 wherein the determining step comprises:
   determining that the given burst has been detected more than the specified number of times.

3. The method of claim 1 wherein the determining step comprises:
   determining that the given burst has been detected less than the specified number of times.

4. The method of claim 1 wherein the specified number of times is equal to one.

5. The method of claim 1 wherein the receiving step comprises:
   receiving the plurality of bursts, the time order of transmission of the plurality of bursts across the plurality of frequency bands encoding the symbol, the symbol corresponding to the data.

6. The method of claim 1 wherein a bandwidth of at least one of the plurality of bursts is at least two percent of the center frequency of the burst.

7. The method of claim 1 wherein a bandwidth of at least one of the plurality of bursts is at least twenty percent of the center frequency of the burst.

8. A multi-band receiver comprising:
   a burst detector module configured to receive and detect each of a plurality of bursts, each burst occupying at least one of a plurality of frequency bands, the plurality of bursts encoding a symbol, the symbol corresponding to data, wherein the symbol is encoded such that a burst occupying each frequency band is transmitted a specified number of times within the plurality of bursts; and
   an error detector coupled to the burst detector module configured to determine that a given burst has not been detected the specified number of times and configured to declare a transmission error for the symbol.

9. A method of signal detection comprising:
   receiving a plurality of bursts, each burst occupying at least one of a plurality of frequency bands, the plurality of bursts encoding a symbol, the symbol corresponding to data, wherein the symbol is encoded such that a burst occupying each frequency band is transmitted once in the plurality of bursts;
   detecting, for a first burst of the plurality of bursts received in time, a first frequency band of the first burst;

removing the first frequency band from a list of available frequency bands;

detecting, for a subsequent burst of the plurality of bursts received in time, a subsequent frequency band of the subsequent burst; and removing the subsequent frequency band from the list of available frequency bands.

10. The method of claim 9 further comprising:

repeating the detecting for the subsequent frequency burst step and the removing the subsequent frequency band step.

11. The method of claim 10 wherein the repeating step is performed until there are no remaining frequency bands in the list of available frequency bands.

12. The method of claim 10 wherein the repeating step is performed until there are no more time slots remaining for the plurality of bursts to occupy.

13. The method of claim 9 wherein the receiving step comprises:

receiving the plurality of bursts, the time order of transmission of the plurality of bursts encoding the symbol, the symbol corresponding to the data.

14. The method of claim 9 further comprising:

declaring the symbol in error in the event a subsequent burst is detected at a frequency band previously removed from the list of available frequency bands.

15. The method of claim 9 wherein a bandwidth of at least one of the plurality of bursts is at least two percent of the center frequency of the burst.

16. The method of claim 9 wherein a bandwidth of at least one of the plurality of bursts is at least twenty percent of the center frequency of the burst.

17. A multi-band receiver comprising:

A burst detector configured to receive a plurality of bursts, each burst occupying at least one of a plurality of frequency bands, the plurality of bursts encoding a symbol, the symbol corresponding to data, wherein the symbol is encoded such that a burst occupying each frequency band is transmitted once in the plurality of bursts;

the burst detector configured to detect, for a first burst of the plurality of bursts received in time, a first frequency band of the first burst;

a signal decoder coupled to an output of the burst detector, the signal decoder configured to remove the first frequency band from a list of available frequency bands;

the burst detector configured to detect, for a subsequent burst of the plurality of bursts received in time, a subsequent frequency band of the subsequent burst; and the signal decoder configured to remove the subsequent frequency band from the list of available frequency bands.

* * * * *